(12) United States Patent
Mallik et al.

(10) Patent No.: US 11,935,808 B2
(45) Date of Patent: Mar. 19, 2024

(54) IC DIE AND HEAT SPREADERS WITH SOLDERABLE THERMAL INTERFACE STRUCTURES FOR MULTI-CHIP ASSEMBLIES INCLUDING SOLDER ARRAY THERMAL INTERCONNECTS

(71) Applicant: Intel Corporation, Santa Clara, CA (US)

(72) Inventors: Debendra Mallik, Chandler, AZ (US); Je-Young Chang, Tempe, AZ (US); Ram Viswanath, Phoenix, AZ (US); Elah Bozorg-Grayeli, Chandler, AZ (US); Ahmad Al Mohammad, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 751 days.

(21) Appl. No.: 16/831,078

(22) Filed: Mar. 26, 2020

(65) Prior Publication Data

US 2021/0305120 A1 Sep. 30, 2021

(51) Int. Cl.
*H01L 23/367* (2006.01)
*H01L 23/373* (2006.01)
*H01L 23/495* (2006.01)

(52) U.S. Cl.
CPC ........ *H01L 23/3672* (2013.01); *H01L 23/373* (2013.01); *H01L 23/49568* (2013.01)

(58) Field of Classification Search
CPC .............. H01L 23/3672; H01L 23/373; H01L 23/49568
See application file for complete search history.

(56) References Cited

U.S. PATENT DOCUMENTS

| 11,387,175 | B2 | 7/2022 | Mallik et al. |
| 11,626,343 | B2 * | 4/2023 | Chen .................... H01L 23/3675 |
| | | | 257/712 |
| 11,735,552 | B2 | 8/2023 | Mallik et al. |
| 2001/0046120 | A1 * | 11/2001 | Lo .......................... H05K 1/056 |
| | | | 257/E21.511 |
| 2004/0080033 | A1 * | 4/2004 | Fang ...................... H01L 23/36 |
| | | | 257/E23.101 |
| 2014/0127488 | A1 | 5/2014 | Zhamu et al. |
| | | | (Continued) |

FOREIGN PATENT DOCUMENTS

CN 201804859 4/2011

*Primary Examiner* — Peniel M Gumedzoe
(74) *Attorney, Agent, or Firm* — Essential Patents Group, LLP

(57) ABSTRACT

Thermal heat spreaders and/or an IC die with solderable thermal structures may be assembled together with a solder array thermal interconnects. A thermal heat spreader may include a non-metallic material and one or more metallized surfaces suitable for bonding to a solder alloy employed as thermal interface material between the heat spreader and an IC die. An IC die may include a metallized back-side surface similarly suitable for bonding to a thermal interconnect comprising a solder alloy. Metallization on the IC die and/or heat spreader may comprise a plurality of solderable structures. A multi-chip package may include multiple IC die having different die thickness that are accommodated by a z-height thickness variation in the thermal interconnects and/or the solderable structures of the IC die or heat spreader.

22 Claims, 19 Drawing Sheets

(56) References Cited

U.S. PATENT DOCUMENTS

| | | | |
|---|---|---|---|
| 2018/0240729 A1* | 8/2018 | Kim | .................... H01L 23/3677 |
| 2018/0269188 A1* | 9/2018 | Yu | ....................... H01L 23/3128 |
| 2019/0067157 A1* | 2/2019 | Lin | ........................ H01L 21/78 |
| 2021/0098332 A1 | 4/2021 | Wang et al. | |
| 2021/0305119 A1 | 9/2021 | Mallik | |
| 2021/0305121 A1 | 9/2021 | Mallik et al. | |

\* cited by examiner

IC DIE AND HEAT SPREADERS WITH SOLDERABLE THERMAL INTERFACE STRUCTURES FOR MULTI-CHIP ASSEMBLIES INCLUDING SOLDER ARRAY THERMAL INTERCONNECTS

RELATED APPLICATIONS

This application is related to U.S. patent application Ser. No. 16/831,068, having the title "IC DIE AND HEAT SPREADERS WITH SOLDERABLE THERMAL INTERFACE STRUCTURES FOR ASSEMBLIES INCLUDING SOLDER ARRAY THERMAL INTERCONNECTS," and filed on Mar. 26, 2020. This application is also related to U.S. patent application Ser. No. 16/831,076, having the title "IC DIE WITH SOLDERABLE THERMAL INTERFACE STRUCTURES FOR ASSEMBLIES INCLUDING SOLDER ARRAY THERMAL INTERCONNECTS," and filed on Mar. 26, 2020.

BACKGROUND

Warpage can be a challenge in the fabrication of thin integrated circuit (IC) device packages. Temperature coefficients of thermal expansion (CTE) may differ between a device and package materials, which may contribute to the problem of warpage. Thin form-factor packages lacking an integrated heat spreader (IHS) can experience a gradual pump-out of thermal interface material (TIM) between an IC die, the IHS, and/or a system level heat-sink or heat-pipe. Such pump-out may be attributed to changes in die surface curvature as the die cycles between cold and hot phases during compute system operation. As TIM is pumped-out, thermal performance of an IC device declines limiting performance and/or lifetime of the compute system.

Thermal performance of an IC device also declines with greater TIM thickness. Variation in die thickness as well as first level interconnect (e.g., solder) height can induce a step height variation between neighboring die of a multi-chip package (MCP). Often, the step height variation is accommodated by the TIM, resulting in the TIM being thicker over a thinner IC die than over a thicker IC die.

IC die and heat spreader structures that can address one or more of these issues would therefore be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
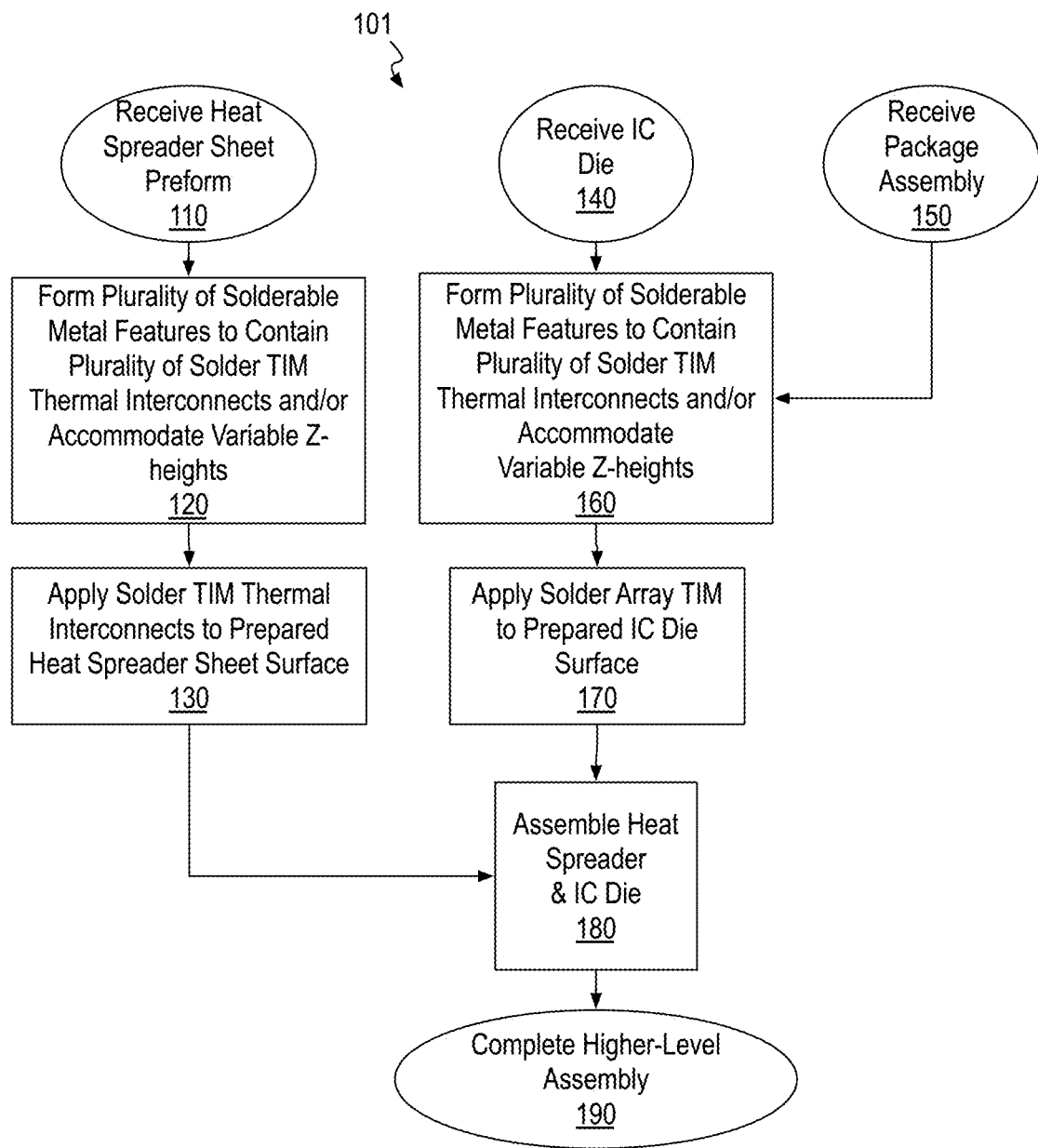
FIG. 1 is a flow diagram illustrating methods of fabricating thermal interconnect structures on an IC die surface and/or a heat spreader, and assembling with a solder array TIM, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material disposed over or under another may be directly in contact or may have one or more intervening materials. Moreover, one material disposed between two materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In accordance with some embodiments herein, a plurality of solderable thermal interface structures are fabricated upon a thermal heat spreader and/or upon a backside surface of an IC die. The heat spreader and the IC die may then be assembled together with a plurality of thermal interconnects comprising solder. This solder thermal interface material (TIM) may be distributed over an area of the heat spreader and/or IC die by a patterning of the thermal interconnect interface structures. An integrated thermal heat spreader may include a non-metallic material, such as a graphite sheet, or other carbon-based preform. One or more surfaces of the non-metallic material may be metallized, and the thermal interconnect interface structures formed thereon. An IC die may include a metallized back-side surface similarly suitable for bonding with a thermal interconnect comprising a solder alloy. A thickness of the thermal interconnects and/or a thickness of the solderable thermal interconnect interface structures may be varied over the area of a heat spreader to accommodate multiple IC die thickness associated with various IC die of a multi-chip package.

As further described below, solderable thermal interconnect interface structures may be fabricated by patterning a metal layer of a heat spreader. Solderable thermal interconnect interface structures may also be fabricated by patterning a metal layer on a backside of an IC die. In other embodiments, solderable thermal interconnect interface structures may be fabricated by additively depositing mask material and/or metal in selective regions on a backside of an IC die or heat spreader.

Through the application of one or more techniques described below, the thickness (i.e., z-height) of a heat spreader and/or the thickness of thermal interconnects between a heat spreader and an IC die may each be reduced to less than 100 μm. Such low thicknesses are well-suited to thin IC device assembly applications, and thermal resistance is also significantly reduced below that of assemblies having significantly greater thickness.

FIG. 1 is a flow diagram illustrating methods 101 for fabricating solderable thermal interconnect interface structures on an IC die surface and/or a heat spreader sheet, and assembling with a plurality of thermal interconnects comprising a solder TIM, in accordance with some embodiments.

In methods 101, a heat spreader preform is received as a first input 110. The preform may be of any material having sufficient mechanical stiffness (e.g., modulus of elasticity) and sufficient thermal conductivity (K). As described further below, the heat spreader preform may comprise a metallic sheet, or a non-metallic sheet. The non-metallic sheet may be a composite including a filler material in a matrix material, or a sheet of a substantially homogeneous carbon-based material. In some exemplary embodiments, the homogeneous carbon-based material is graphite, which may advantageously be a pyrolytic graphite sheet (PGS) having a high thermal in-plane conductivity (e.g., >1700 W/mK).

Methods 101 continue at block 120 where a plurality of solderable metal features is fabricated upon the heat spreader. These features are to be spaced apart over an area of the heat spreader so to provide discrete interfaces to a plurality thermal interconnects, each of which comprise a solder TIM. These features may interface the solder TIM to a preform of non-metallic composition (e.g. PGS) or of any other composition having relatively poor solder wetting. These features may also be fabricated so as to have multiple z-heights over different areas of the heat spreader so as to enable a heat spreader preform of substantially uniform thickness to span multiple IC die of different z-heights. As described further below, subtractive and additive techniques may be applied to fabricate these solderable metal features.

Methods 101 continue at block 130 where a plurality of solder TIM thermal interconnects is applied to the prepared heat spreader surface. Any solder TIM composition known to be suitable as a thermal interconnect between an IC die and a heat spreader may be applied at block 130. Upon application of the array of solder TIM thermal interconnects, the resulting heat spreader may be staged for subsequent assembly with one or more IC die. In some embodiments, an under/over fill material may be applied prior to assembly with an IC die to at least partially surround the plurality of solder TIM thermal interconnects. This material may have any composition known to be suitable as a solder feature underfill. Noting that some materials may degrade over time, underfill may instead be applied during assembly of an IC die and a heat spreader at block 180 unless pre-applied material can be B-staged reliably.

In methods 101, an IC die is received as a second input 140. The IC die received may be any IC die having a first (front) side including integrated circuitry comprising transistors coupled to one or more levels of metallization terminating at plurality of interfaces suitable for connection to a host component (e.g., a package substrate) through any first level electrical interconnects, such as solder features (e.g., microbumps, etc.). IC die received at input 140 may be in a wafer format or a panelized format such that subsequent operations may be performed at the wafer-level or panel-level. Alternatively, a package assembly may be received as a third input 150. The package assembly received at input 140 may include one or more IC die. Front sides of the IC die are electrically interconnected to a package substrate and a back side of the IC die are exposed and ready for further processing to be performed at the package level.

Continuing from input 140 or 150, at block 160 a plurality of solderable metal features is fabricated upon a second (back) side of the IC die. These features are to be spaced apart over an area of the IC die so to provide discrete interfaces to a plurality thermal interconnects, each of which comprises a solder TIM. These features may interface the solder TIM to a crystalline substrate of the IC die (e.g. crystalline silicon, germanium, group IV alloy, III-V alloy, III-N alloy, etc.). These features may be fabricated so as to have any z-height. As described further below, subtractive and additive techniques may be applied to fabricate these solderable metal features either while a die is in a wafer/panelized format, or during packaging of a die.

Methods 101 continue at block 170 where a plurality of solder TIM thermal interconnects is applied to the prepared IC die surface. Any solder TIM composition known to be suitable as a thermal interconnect between an IC die and a heat spreader may be applied at block 170. Upon application of the array of solder TIM thermal interconnects, the resulting IC die may be staged for subsequent assembly with a heat spreader and/or a package substrate. In some embodiments, an under/over fill material may be pre-applied to at least partially surround the plurality of solder TIM thermal interconnects. This material may have any composition known to be suitable as a solder feature underfill. Noting that some materials may degrade over time, underfill may instead be applied during assembly of an IC die and a heat spreader at block 180 unless pre-applied material can be B-staged reliably.

Methods 101 continue at block 180 where a heat spreader is assembled to the back side of the IC die. In some embodiments, both of the heat spreader and the IC die have been output from blocks 130 and 170, respectively. In other embodiments, at least one of the IC heat spreader and the IC die has been prepared through block 130 and 170, respectively. For example, a heat spreader that has been prepared according to blocks 120 and 130 may be assembled at block 180 with an IC die having any surface preparation. In other examples, an IC die back side that has been prepared according to blocks 160 and 170 may be assembled at block 180 with any IC die heat spreader. In still other examples, a heat spreader that has been prepared according to blocks 120 and 130 is assembled with an IC die having a back side that has been prepared according to blocks 160 and 170.

Methods 101 then end at output 190 where the IC die-heat spreader assembly is integrated into any suitable higher-level assembly. In some embodiments, an IC die of the assembly is coupled to a package substrate with any first level electrical interconnects known to be suitable. In some other embodiments, a package substrate is coupled to a host component, such as printed circuit board, for example through any second level electrical interconnects known to be suitable. In some further embodiments, a heat spreader is coupled to a heat exchanger, such as a finned heat sink, a heat pipe, vapor chamber, or the like.

FIG. 2A-2F illustrate exploded isometric views of some exemplary system-level IC device assemblies, which may be manufactured through the practice of methods 101. While the system-level assemblies illustrated in FIG. 2A-2F serve to further describe various structural features associated with one or more advantageous embodiments, these assemblies may be fabricated according to methods other than methods 101. Similarly, methods 101 may also be practiced to arrive at assemblies other than those exemplified by FIG. 2A-2F.

As described further below, the assemblies depicted in FIG. 2A-2F may advantageously facilitate spatially distributing a plurality of solder TIM thermal interconnects between IC die and a heat spreader, and allow such thermal interconnects to have minimal z-height (thickness) and/or enable a substantially planar sheet material of high in-plane thermal conductivity to thermally couple to multiple IC die of different die thicknesses.

Figure 2A:
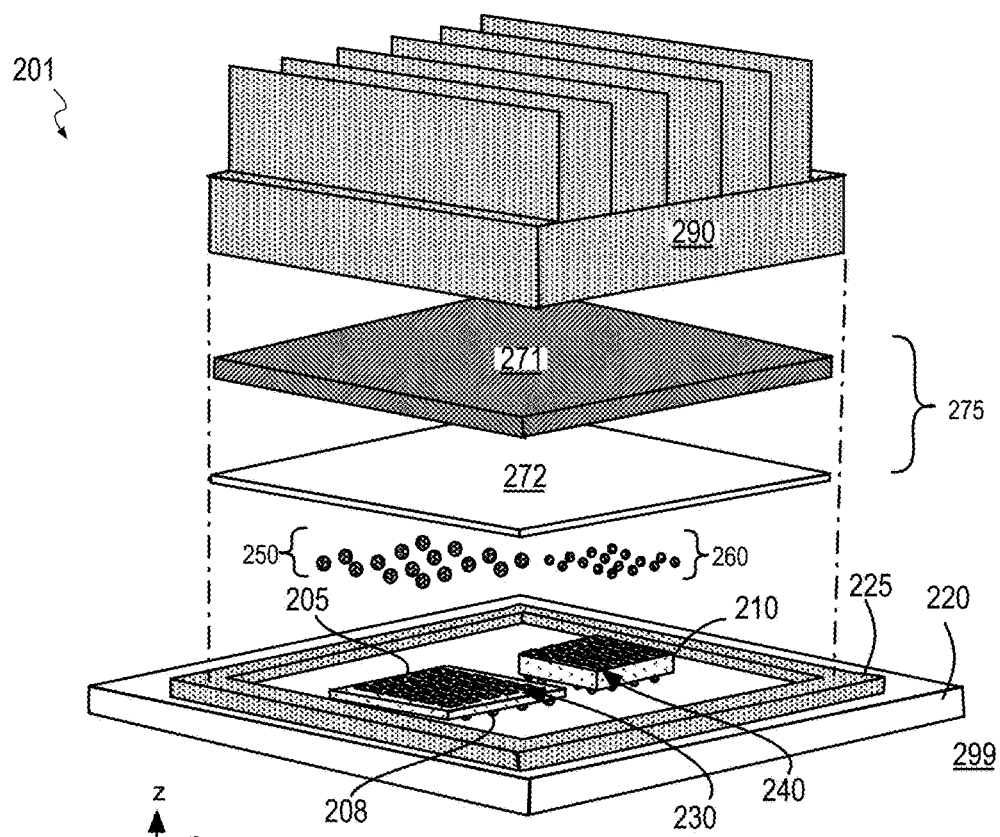
FIGS. 2A, 2B, 2C, 2D, 2E and 2F illustrate exploded isometric views of system-level IC device assemblies, in accordance with some embodiments.
Figure 2B:
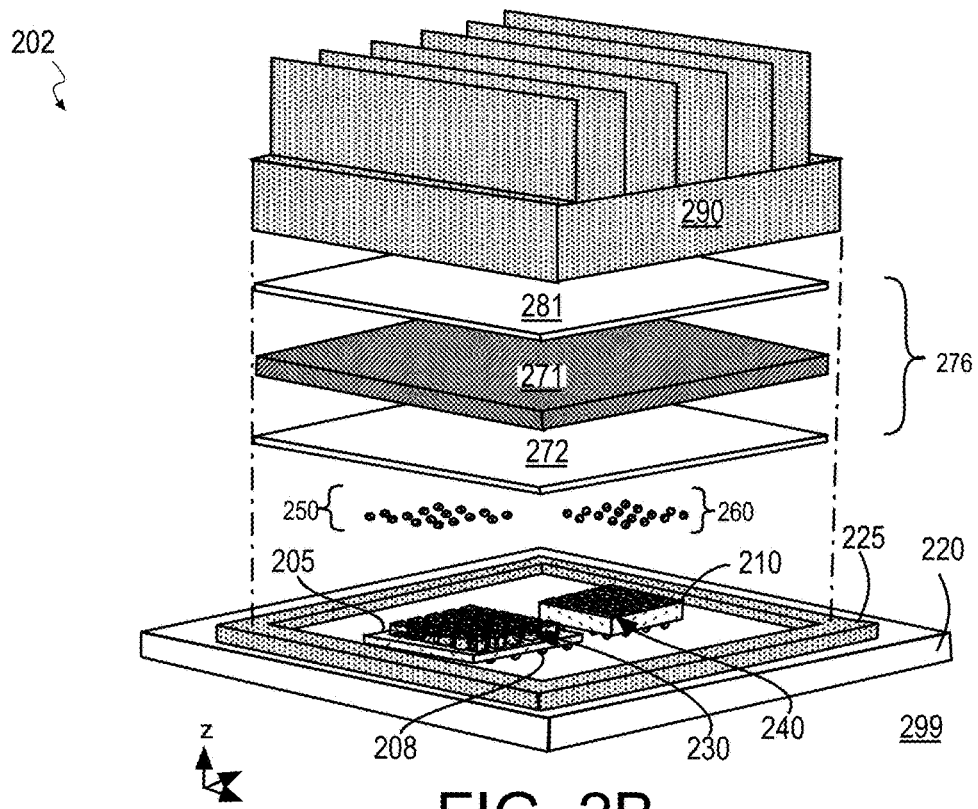

FIG. 2A-2B illustrate some exemplary assemblies where a heat spreader is integrated with a plurality of IC die having surfaces that have been prepared by methods 101. Referring first to FIG. 2A, IC device assembly 201 includes a package substrate 220 which may be any package substrate (or "package") suitable for interfacing a host component 299 to one or more IC die. Device assembly 201 comprises a multi-chip package that includes both an IC die 205, and an IC die 210 laterally adjacent to IC die 205. An active side of each of IC die 205 and 210 includes integrated circuitry having die interfaces that are attached to package substrate 220 through a plurality of first-level electrical interconnects 208. First-level interconnects 208 may be microbumps or any another solder-based or solder-free interconnect suitable for flip-chip assembly, for example.

IC die 205, 210 may each have been prepared and electrically tested, for example according to any suitable fabrication, die prep, and e-test processes. As an example, IC die 205 may be a first of any of a wireless radio circuit, microprocessor or graphics processor circuit, electronic memory circuit, floating point gate array (FPGA), power management and/or power supply circuitry, or MEMS device. As a further example, IC die 210 may be a second of any of a wireless radio circuit, microprocessor or graphics processor circuit, electronic memory circuit, FPGA, power management and/or power supply circuitry, or MEMS device. In some specific examples, IC die 205 is a microprocessor and IC die 210 is an electronic memory. One or more of IC die 205, 210 may comprise an IC die stack. For example, an electronic memory may comprise a stack of IC die. Although two IC die are illustrated for the sake of discussion, any number of IC die may be interfaced to package substrate 220. In some embodiments, IC die attached to package substrate 220 have different die thicknesses (e.g., z-dimension). For examples represented by FIG. 2A, IC die 210 is significantly thicker (e.g., more than 50 μm, and may be 250-500 μm thicker) than IC die 205.

Package substrate 220 may comprise any type of substrate suitable for providing electrical communications between IC die 205 or IC die 210, and to the next-level host component 299 to which package substrate 220 may be coupled (e.g., through second-level electrical interconnects). Host component 299 may be a circuit board, or another package level, for example. Package substrate 220 may also provide structural support for IC die 205, 210. As described further below, package substrate may be a multi-layer structure that includes levels of package metallization and layers of a package dielectric material that have been successively built-up around a core. The package core may be a dielectric material, for example, and may further include conductive through-via structures. In other embodiments, package substrate 220 may comprise a coreless multi-layer structure, in which case through-via structures may be present, or not.

As further shown in FIG. 2A, a structural member 225 is attached to package substrate 220. Package substrate 220 may have a relatively low elastic modulus, and so may deform extensively when subjected to stress, such as that imparted through thermal expansion. Structural member 225 may be of any material and have any dimensions suitable for enhancing package rigidity and/or otherwise controlling package warp. As such, structural member 225 may be of any material having a larger elastic modulus (greater stiffness) than package substrate 220. Structural member 225 may comprise a bulk metal (e.g., steel, stainless steel, aluminum, etc.) and may also have a surface finish (e.g., nickel, etc.).

In the illustrated embodiments, a number of thermal interconnect interface structures 230 are spaced apart over an area of the back side of IC die 205. A back side of IC die 210 similarly includes a plurality of thermal interconnect interface structures 240 spaced apart over an area of the IC die 210. In exemplary embodiments, thermal interconnect interface structures 230, 240 each comprise one or more metals with a surface finish of the thermal interconnect interface structures 230, 240 being of a composition that is solderable. As such, thermal interconnect interface structures 230, 240 may be referred to herein as "thermal interconnect lands," and because at least the surface finish is a metal, thermal interconnect interface structures 230, 240 may also be referred to herein as "metallic lands". Thermal interconnect interface structures 230, 240 may have any dimensions and/or feature pitch. In some embodiments, thermal interconnect interface structures 230, 240 have substantially the same feature pitch as that of features on front side of IC die 205, 210 that are coupled to first-level electrical interconnect 208. In other embodiments, thermal interconnect interface structures 230, 240 may have a significantly larger feature pitch than that of features on front side of IC die 205, 210. As noted further below, the thickness (e.g., z-dimension) of thermal interconnect interface structures 230, 240 may vary widely.

As further shown in FIG. 2A, individual ones of thermal interconnect interfaces 230 are joined to, or bonded with, corresponding ones of a plurality of thermal interconnects 250. Similarly, individual ones of thermal interconnect interfaces 240 are joined to, or bonded with, corresponding ones of a plurality of thermal interconnects 260. Thermal interconnects 250 and 260 are both a solder TIM, for example comprising a metal alloy composition having a sufficiently low melting temperature to form an intermetallic compound with interconnect interfaces 230, 240 so as to form a good thermal joint. Because the application of solder TIM can be challenging due to the tight process controls needed to form good thermal joints, the presence of discrete thermal interconnect interface structures 230, 240 may have advantages over a contiguous metal layer spanning the entire area of IC dies 205, 210.

In the illustrated example, while thermal interconnects 250, 260 may have substantially the same solder alloy composition, their dimensions (e.g., radius, and/or diameter, pitch and/or z-height) may differ. In some embodiments, individual ones of thermal interconnects 250 have larger lateral and/or vertical dimensions than individual ones of thermal interconnects 260. The target vertical dimension of thermal interconnects 250 may be larger than the target dimension of thermal interconnects 260 by an amount that fully accommodates the amount by which the die thickness of IC die 205 is less than the die thickness of IC die 210. As such, the feature pitch of thermal interconnect interfaces 230 may be larger than the feature pitch of thermal interconnect interfaces 240.

Although not illustrated for the sake of clarity, IC device assembly 201 may further comprise an underfill material between individual ones of thermal interconnects 250, 260. Such an underfill material may have any suitable composition (e.g., a polymer dielectric such as one including an epoxy resin with a filler like fumed silica). The epoxy resin and filler may be selected to achieve a good coefficient of thermal expansion (CTE) match with thermal interconnects 250, 260 and/or with IC die 205, 210.

IC device assembly 201 further includes an integrated heat spreader 275. Heat spreader 275 may be of one more materials having sufficient thermal conductivity, and may have any thickness suitable to provide sufficient rigidity and/or protection to the underlying IC die 205, 210. Although any heat spreader 275 architecture compatible with thermal interconnects 250, 260 may be employed, in the illustrated embodiments heat spreader 275 has a laminate architecture that includes a sheet material 271 and a solderable metal 272 between sheet material 271 and the plurality of thermal interconnects 250, 260. Solderable metal 272 may be any metal with adequate solder TIM wetting. In some embodiments solderable metal 272 includes at least one of Cu, W, Ti, Ru, or Co, and may further include a surface finish such as, but not limited to Ni and/or Au. The thickness of solderable metal 272 may vary widely. For some embodiments, solderable metal 272 has a thickness below 100 μm and may be 25 μm, or less (e.g., 15-25 μm). This limited thickness is advantageous for reducing thermal resistance of heat spreader 275. For embodiments illustrated by FIG. 2A, solderable metal 272 is a contiguous layer spanning at least a majority of, and perhaps substantially the entire, area of sheet material 271. One or more of underfill material or thermal interconnect interfaces 230, 240 may serve to contain/maintain any desired spatial arrangement of thermal interconnects 250, 260. With such containment, the overall z-height of individual ones of thermal interconnects 250 and 260 may be minimized to a bond line thickness (BLT) of less than 100 μm even if the interconnects bond to a contiguous sheet of solderable metal 272. This BLT is considerably smaller than the 200-300 μm BLT that can occur where a solder TIM is allowed to simply form a contiguous pool over individual ones of IC die 205, 210.

As shown in FIG. 2A, sheet material 271 may be substantially planar. In the presence of solderable metal 272, sheet material 271 may have a wide range of compositions such as other metals (e.g., having poorer solder wetting than metal 272), or a non-metallic material. In some exemplary embodiments, sheet material 271 is a planar sheet of a material that is predominantly carbon. This carbon-based material may, for example, comprise carbon nanotubes or graphitic particles in a matrix material. In some other carbon-based embodiments, sheet material 271 is a sheet of graphite. The graphite sheet may be of pyrolytic, or crystalline, graphite, for example. Such graphite sheets offer significant mechanical stiffness at thicknesses well below 100 μm, and also offer very high thermal conductivity values, particularly in the plane of sheet material 271. In some exemplary embodiments sheet material 271 has a thickness of 25 μm, or less (e.g., 15-25 μm). Graphite sheets, as well as certain other carbon-based materials also display favorably small linear coefficients of thermal expansion (CTE), which can help heat spreader 275 match a CTE associated with IC die 205, 210 better than a bulk metal alone.

Heat spreader 275 may have any area, and in some advantageous embodiments has an area sufficient to completely cover any underlying IC die. In the illustrated example, sheet material 271 has an area sufficient to extend beyond an edge of both IC die 205 and IC die 210 and make contact with structural member (stiffener) 225. As further described elsewhere herein, where structural member 225 is absent, heat spreader 275 may similarly extend beyond an edge of at least one IC die and be supported by one or more solder features (e.g., solder balls), or be a cantilevered overhang. In other embodiments, heat spreader 275 may be dimensioned to have an area substantially equal to that of the one or more underlying IC die.

IC device assembly 201 further includes an IC die package thermal solution 290 that may be in direct contact with heat spreader 275 (e.g., sheet material 271), or coupled to it through a second-level TIM (not depicted). The thermal solution may be any heat exchanger known to be suitable for an IC die and/or multi-chip package. Although heat exchanger architecture may vary, it generally includes a surface that is to be placed in direct contact or close proximity to heat spreader 275. The heat exchanger may be a finned heat sink, cold plate, or heat pipe (vapor chamber), for example.

Referring next to FIG. 2B, IC device assembly 202 is another example that includes package substrate 220 with an active side of each of IC die 205 and IC die 210 attached to package substrate 220 through a plurality of first-level electrical interconnects 208. References that were introduced in FIG. 2A are also used in FIG. 2B where one or more of the attributes described in the context of FIG. 2A are also applicable for the embodiments represented by FIG. 2B. In IC device assembly 202, IC die 210 is again significantly thicker (e.g., more than 50 μm, and may be 250-500 μm thicker, or more) than IC die 205.

As shown in FIG. 2B, the thermal interconnect interface structures 230 are again spaced apart over an area of the back side of IC die 205 while the back side of IC die 210 similarly includes a plurality of thermal interconnect interface structures 240. Thermal interconnect interface structures 230, 240 each comprise one or more metals with a surface finish of the thermal interconnect interface structures 230, 240 being of a solderable composition. As shown, thermal interconnect interface structures 230 have a greater z-height, or thickness, out of the plane of IC die 205 than do interface structures 240. Hence, relative to interface structures 240, interface structures 230 may be considered pillars having a greater z-dimension height than some minimal z-thickness of interface structures 240.

Although their z-heights differ, each of the thermal interconnect interface structures 230 and 240 may have any lateral dimensions and/or feature pitch suitable for bonding with solder TIM thermal interconnects 250, 260. In some embodiments, one or both of thermal interconnect interface structures 230, 240 may have substantially the same feature pitch as features on front side of IC die 205, 210 that are coupled to first-level electrical interconnects 208. In other embodiments, one or both of thermal interconnect interface structures 230, 240 may have a significantly larger feature pitch than features on front side of IC die 205, 210.

Individual ones of thermal interconnect interfaces 230, 240 are joined to, or bonded with, corresponding ones of a plurality of solder TIM thermal interconnects 250, 260. In the illustrated example, thermal interconnects 250 have substantially the same solder alloy composition and target dimensions (e.g., spherical radius, and/or diameter, and/or z-height) as solder TIM thermal interconnects 260. The target dimension of thermal interconnects 250 and 260 may be same where the z-height of thermal interconnect features 230 is sufficiently more than the z-height of thermal interconnect features 240 to fully accommodate the amount by which the die thickness of IC die 205 is less than the die thickness of IC die 210. Although not illustrated for the sake of clarity, IC device assembly 202 may also have an underfill material between individual ones of thermal interconnects 250, 260.

IC device assembly 202 further includes an integrated heat spreader 276. For the exemplary embodiments illustrated in FIG. 2B, heat spreader 276 includes a sheet material 271 with metal 272 on a side facing IC die 205, 210, and a metal 281 on an opposite side of sheet material 271. In some embodiments, metal 281 is also a solderable metal and may be substantially the same composition as metal 272 and/or have the same thickness as solderable metal 272. In some embodiments, metal 281 includes at least one of Cu, W, Ti, Ru, or Co, and may further include a surface finish such as, but not limited to Ni and/or Au. The thickness of metal 281 may vary, but in some embodiments, metal 281 has substantially the same thickness as metal 272, which may help to maintain planarity of heat spreader 276 during thermal cycles (e.g., by balancing CTE differences of the component materials in the laminate heat spreader). In some specific examples, metal 281 and metal 272 both have a thickness below 100 μm and may both be 25 μm, or less (e.g., 15-25 μm). This limited thickness is advantageous for reducing thermal resistance of heat spreader 275. For embodiments illustrated by FIG. 2B, both metal 272 and metal 281 are each a contiguous layer spanning at least a majority of, and perhaps substantially the entire, area of sheet material 271.

Heat spreader 276 may also have any area, and in some advantageous embodiments has an area sufficient to cover any underlying IC die. In the illustrated example, sheet material 271 has an area sufficient to extend beyond an edge of both IC die 205 and IC die 210 so that solderable metal 272 overlaps structural member (stiffener) 225. As further described elsewhere herein, where structural member 225 is absent, heat spreader 276 may similarly extend beyond an edge of at least one IC die and be supported by one or more solder features (e.g., solder balls), or be a cantilevered overhang. In other embodiments, heat spreader 276 may be dimensioned to have an area substantially equal to that of the one or more underlying IC die. IC device assembly 202 further also includes IC die package thermal solution 290 that may be in direct contact with heat spreader 276 in contact with metal 281), or coupled to it through a second-level TIM (not depicted).

Figure 2C:
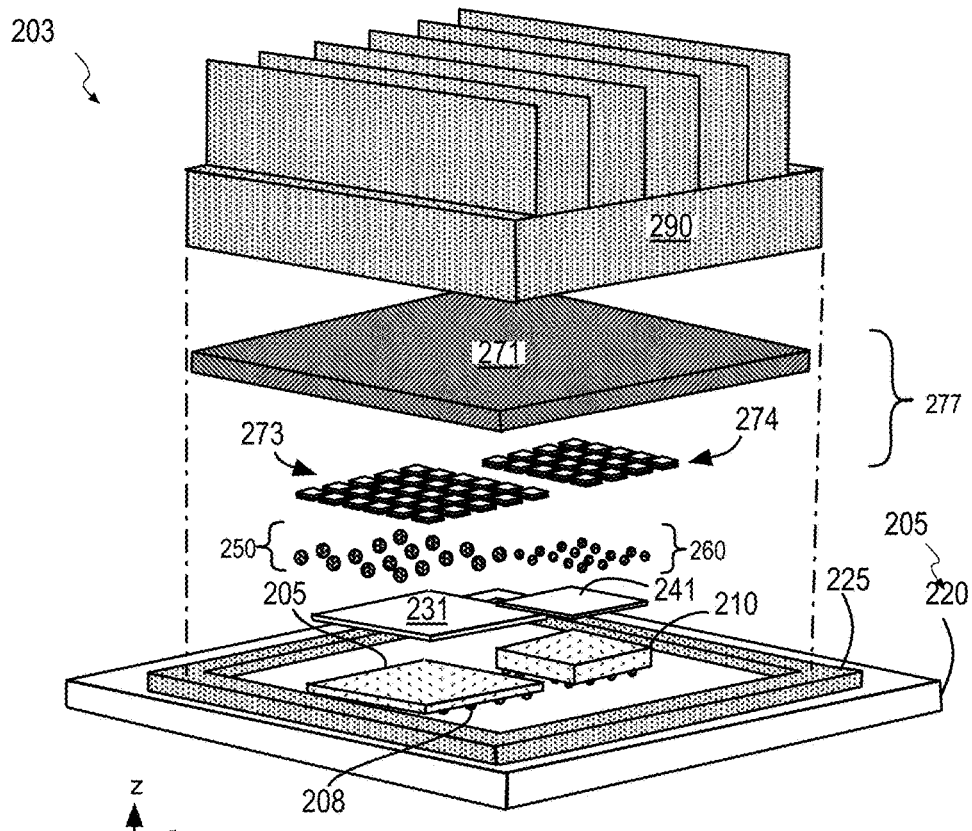
Figure 2D:
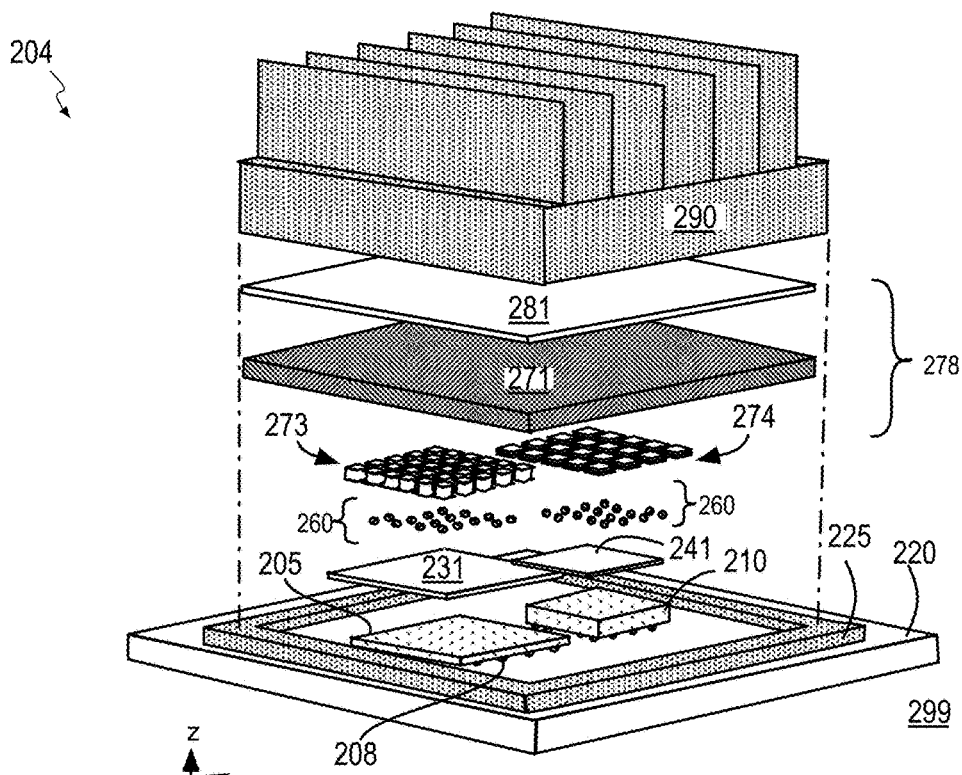

FIG. 2C-2D illustrate some exemplary assemblies where a heat spreader having thermal interconnect lands is integrated with a plurality of IC die. Reference numbers that were introduced in FIG. 2A or FIG. 2B are also used in FIG. 2C and FIG. 2D where one or more of the attributes described in the context of FIG. 2A-2B are also applicable for the embodiments represented by FIG. 2C-2D.

Referring first to FIG. 2C, IC device assembly 203 includes package substrate 220 with an active side of each of IC die 205 and IC die 210 attached to package substrate 220 through a plurality of first-level electrical interconnects. For these embodiments, IC die 210 is again significantly thicker (e.g., more than 50 μm, and may be 250-500 μm thicker, or more) than IC die 205.

A metal layer 231 is on the back side of IC die 205, and a metal layer 241 is on the back side of IC die 210. Backside metal layers 231, 241 may each have a solderable composition. Although backside metal layers 231, 241 may have different thicknesses, for example to at least partially accommodate a difference in die thickness of IC die 205 and IC die 210, in some embodiments backside metal layers 231, 241 have substantially the same thickness. As one example, backside metal layers 231, 241 have a thickness less than 100 μm. Backside metal layers 231, 241 may function as an interface to solder TIM thermal interconnects 250, 260, respectively. However, since backside metal layers 231, 241 are contiguous, unpatterned sheets, spanning, for example, a majority of the IC die area, other structures within assembly 203 are relied upon to maintain a desired spatial distribution of thermal interconnects 250, 260.

Backside metal layer 231 is joined to, or bonded with, individual ones of a plurality of solder TIM thermal interconnects 250. Similarly, backside metal layer 241 is joined to, or bonded with, corresponding ones of a plurality of thermal interconnects 260. Thermal interconnects 250 and 260 are both a solder TIM. In the illustrated example, thermal interconnects 250 and 260 have different dimensions (e.g., spherical radius, and/or diameter, and/or z-height). As shown, individual ones of thermal interconnects 250 have larger dimensions than individual ones of thermal interconnects 260. The target dimension of thermal interconnects 250 may be larger than the target dimension of thermal interconnects 260 by an amount that substantially accommodates the amount by which the die thickness of IC die 205 is less than the die thickness of IC die 210. Although not illustrated for the sake of clarity, IC device assembly 203 may further comprise an underfill material between individual ones of thermal interconnects 250, 260.

IC device assembly 203 further includes an integrated heat spreader 277. In this exemplary embodiment, heat spreader 277 includes a plurality of discrete thermal interconnect interface structures (or lands) 273 and 274 on a side of sheet material 271 facing IC die 205, 210. Interface structures 273 and 274, in a manner similar to thermal interconnect interfaces 230, 240 of assembly 201 (FIG. 2A), may advantageously define and/or maintain a desired spatial distribution of thermal interconnects 250, 260.

For embodiments illustrated in FIG. 2C, thermal interconnect interface structures 273 are spaced apart over a first area of heat spreader 277 that overlies the back side of IC die 205. Thermal interconnect interface structures 274 are similarly spaced apart over a second area of heat spreader 277 that overlies the back side of IC die 210. In exemplary embodiments, thermal interconnect interface structures 273, 274 each comprise one or more metals with a surface finish being of a composition that is solderable. Thermal interface structures 273, 274 may be of the same composition. Thermal interconnect interface structures 273, 274 may have any lateral dimensions and/or feature pitch. In some embodiments, thermal interconnect interface structures 273, 274 may have substantially the same feature pitch as that of features on front side of IC die 205, 210 that are coupled to first-level electrical interconnect 208. In other embodiments, thermal interconnect interface structures 273, 274 may have a significantly larger feature pitch than that of features on front side of IC die 205, 210. In the examples illustrated by FIG. 2C where solder TIM thermal interconnects 250, 260 have different dimensions, feature pitch of thermal interconnect interface structures 273 may be different (e.g., larger) than the feature pitch of thermal interconnect interface structures 274. As noted further below, thermal interconnect interface structures 230, 240 may have any thickness (e.g., z-dimension). In some specific examples, thermal interconnect interface structures 273, 274 both have a thickness below 100 μm and may both be 25 μm, or less (e.g., 15-25 μm). Individual ones of thermal interconnect interfaces 273 are joined to, or bonded with, corresponding ones of a plurality of thermal interconnects 250. Similarly, individual ones of thermal interconnect interfaces 274 are joined to, or bonded with, corresponding ones of a plurality of thermal interconnects 260.

Heat spreader 277 may also have any area, and in some advantageous embodiments has an area sufficient to cover any underlying IC die. In the illustrated example, sheet material 271 has an area sufficient to extend beyond an edge of both IC die 205 and IC die 210 so that sheet material 271 overlaps structural member (stiffener) 225. As further described elsewhere herein, if structural member 225 is absent, heat spreader 277 may similarly extend beyond an edge of at least one IC die and be supported by one or more solder features (e.g., solder balls), or be a cantilevered overhang. In other embodiments, heat spreader 277 may be dimensioned to have an area substantially equal to that of the one or more underlying IC die.

Sheet material 271 may have any of the compositions described above (e.g., a pyrolytic graphite sheet, a composite material sheet, a metal sheet, etc.). In some embodiments, thermal interconnect interface structures 273, 274 are in direct contact with sheet material 271, but there may also be one or more intervening materials. In this example, one side of sheet material 271 is in direct contact with IC die package thermal solution 290. However, IC die package thermal solution 290 may be in direct contact with another material of heat spreader 277, such as a metallization layer (not depicted), and/or coupled to heat spreader 277 through a second-level TIM (not depicted).

Referring next to FIG. 2D, IC device assembly 204 is another example that includes package substrate 220 with an active side of each of IC die 205 and IC die 210 attached to package substrate 220 through a plurality of first-level electrical interconnects. In assembly 204, IC die 210 is again significantly thicker (e.g., more than 50 μm, and may be 250-500 μm thicker, or more) than IC die 205. In assembly 204, the difference in die thickness is at least partially accommodated by heat spreader 278, which includes thermal interconnect interface structures 273 that have a greater z-height that thermal interconnect interface structures 274. Hence, for such embodiments, thermal interconnect interface structures 273, 274 allow sheet material 271 to thermally couple to IC die of differing thicknesses, and also facilitate minimal thermal interconnect z-heights by maintaining a predetermined spatial distribution of solder TIM features having some minimal target dimensions (e.g., 50-100 μm).

Similar to assembly 203 (FIG. 2C), backside metal layers 231, 241 are on IC die 205, 210 (e.g., in direct contact with a crystalline substrate material or a dielectric material, such as SiN, thereon). Although backside metal layers 231, 241 may again have different thicknesses, in some embodiments backside metal layers 231, 241 have substantially the same thickness (e.g., 15-25 μm). Backside metal layers 231, 241 interface with solder TIM thermal interconnects 250, 260, respectively. In assembly 204, thermal interconnects 250, 260 have substantially the same dimension. For example thermal interconnects 250, 260 may be solder features of one target diameter, or have the same lateral (x-y) and vertical (z) dimensions.

As shown in FIG. 2D, thermal interconnect interface structures 273 and 274 are spaced apart over an area of a heat spreader sheet material 271. For the embodiments illustrated, thermal interconnect interface structures 273 have a greater z-height, or thickness, out of the plane of IC die 205 than interface structures 274. Hence, thermal interconnect interface structures 273 may be considered pillars similar to the die-side interface structures 230 of assembly 202 (FIG. 2B). Thermal interconnect interface structures 274, in contrast, may have some minimal z-thickness sufficient for functioning as discrete lands for solder TIM thermal interconnects 260 that maintain a spatial distribution and minimal thermal interconnect z-height (e.g., of 50-100 μm). Although their z-heights differ, each of interface structures 273 and 274 may have any lateral dimensions and/or feature pitch. In some embodiments, thermal interconnect interface structures 273 and 274 both have substantially the same feature pitch, which may be substantially equal to the pitch of features on front side of IC die 205, 210 that are coupled to first-level electrical interconnect 208, or significantly larger.

Although not illustrated for the sake of clarity, IC device assembly 202 may also have an underfill material between individual ones of thermal interconnects 250, 260 and/or between individual ones of thermal interconnect interface structures 273, 274. IC device assembly 204 further includes an integrated heat spreader 278. In this exemplary embodiment, heat spreader 278 includes sheet material 271 and metal 281 on a side of sheet material 271 opposite IC die 205, 210. Metal 281 is again a contiguous layer spanning at least a majority of, and perhaps substantially the entire, area of sheet material 271.

Heat spreader 278 may have any area, and in some advantageous embodiments has an area sufficient to cover any underlying IC die. In the illustrated example, sheet material 271 has an area sufficient to extend beyond an edge of both IC die 205 and IC die 210 so that sheet material 271 overlaps structural member (stiffener) 225. Thermal interconnect interface structures 273 and/or 274 may also overlap with structural member 225. As further described elsewhere herein, if structural member 225 is absent, heat spreader 278 may similarly extend beyond an edge of at least one IC die and be supported by one or more solder features (e.g., solder balls), or be a cantilevered overhang. In other embodiments, heat spreader 278 may be dimensioned to have an area substantially equal to that of the one or more underlying IC die. IC die package thermal solution 290 may be in direct contact with heat spreader 278 (e.g., in contact with metal 281), or coupled to heat spreader 278 through a second-level TIM (not depicted)

Figure 2E:
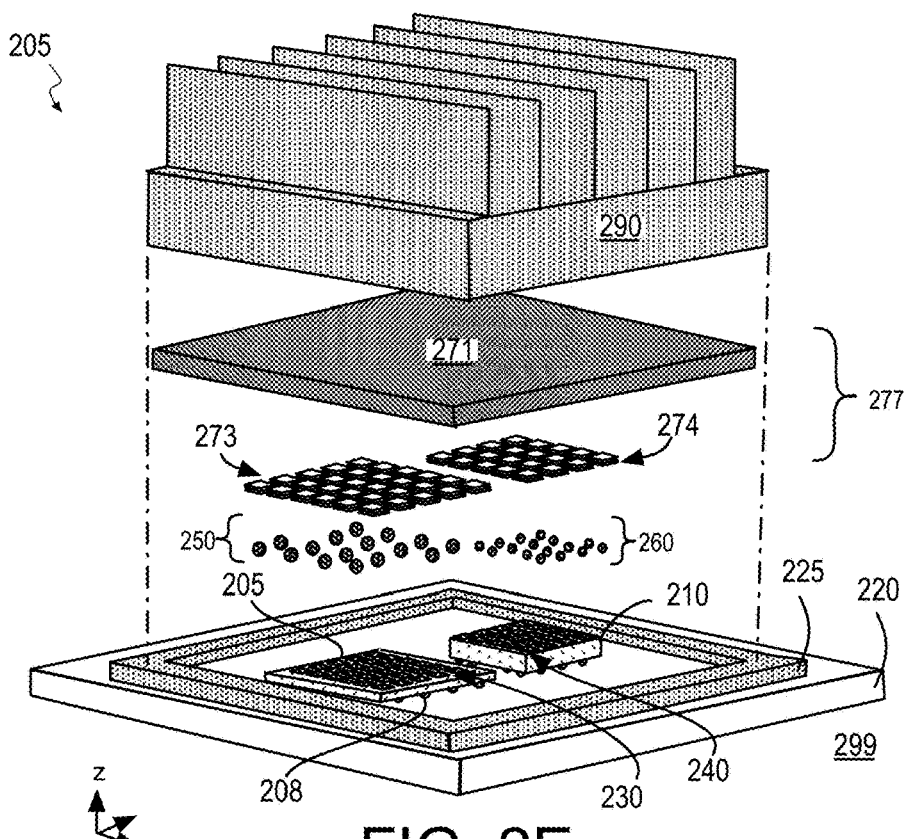
Figure 2F:
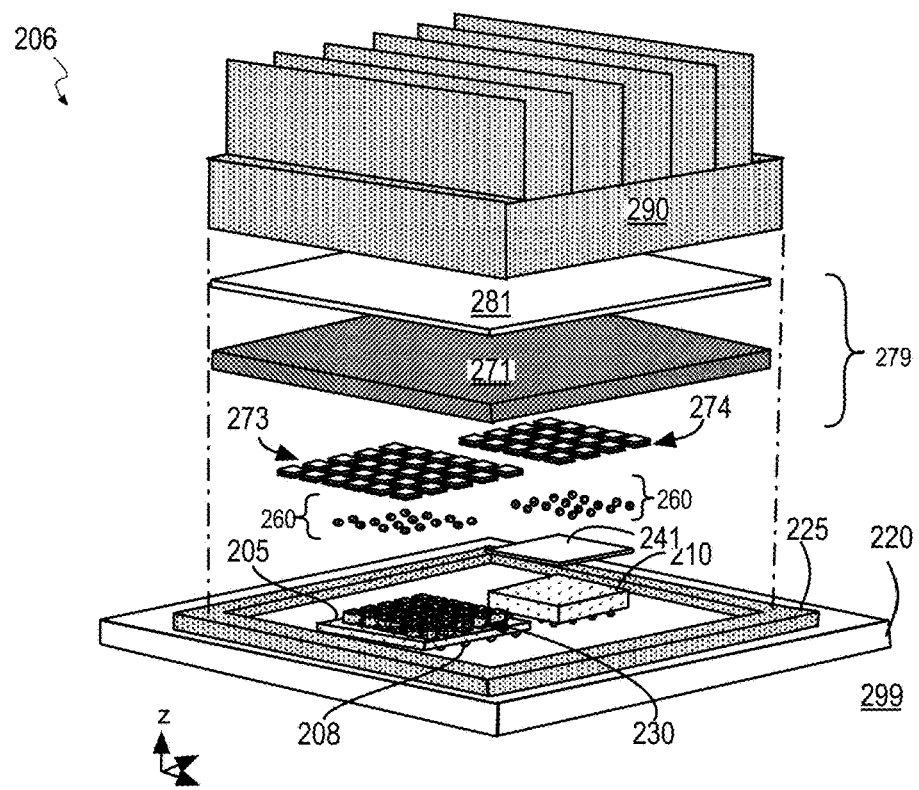

FIGS. 2E and 2F illustrate two more ID die assemblies 206, 207, which combine certain IC-die side thermal interconnect interface features of assembly 203 with certain heat spreader-size thermal interconnect interface features of assemblies 201 and 202. Assemblies 206 and 207 therefore illustrate examples of how the various features introduced in the context of FIG. 2A-2D may be combined together. Reference numbers introduced in FIG. 2A-2D are retained in FIG. 2E-2F where one or more of the attributes previously described are also applicable for the embodiments represented by FIG. 2E-2F.

In assemblies 206 and 207, IC die 210 is significantly thicker than IC die 205. In assembly 206, the difference in IC die thickness is at least partially accommodated by solder TIM thermal interconnects 250, 260, for example substantially as described above. In assembly 207, the difference in IC die thickness is instead at least partially accommodated by a z-height of thermal interface structures 230 on the back side of IC die 205.

As shown in FIG. 2E, assembly 206 includes heat spreader 277, which may be substantially as described for assembly 203 (FIG. 2C). In assembly 206, thermal interface structures 273 and 274 are spatially distributed to locate solder TIM thermal interconnects 250 and 260, respectively. Rather than a contiguous metallization layer, the back side of IC die 205 and 210 further include thermal interconnect interface structures 230 and 240, which may be substantially as described for assembly 201 (FIG. 2A). Hence, discrete solder TIM lands are present both on the IC die 205, 210 and on heat spreader 277. The spatial array of interface structures 230 are in alignment with the spatial array of interface structures 273, and the spatial array of interface structures 240 are in alignment with the spatial array of interface structures 274. Thermal interconnects 250, 260 may therefore be precisely located over an area of the joint between heat spreader 277 and IC die 205, 210. The precise positioning may also be maintained over time, (e.g., suffering minimal TIM pump-out in the face of IC die warpage, etc.).

In FIG. 2F, assembly 207 includes a heat spreader 279 that is similar in architecture to heat spreader 277, but further includes metal 281, substantially as described in the context of assemblies 202 (FIG. 2B) and 204 (FIG. 2D). Assembly 207 illustrates an exemplary architecture where the pluralities of solder TIM thermal interconnects 250 and 260 have substantially the same dimensions (e.g., z-height). Differences in die thickness is at least partially accommodated by thermal interconnect interface structures 230, which may be significantly thicker than metal 241 on the back side of IC die 210. Hence, IC die with different back-side surface structures may be combined within a multi-chip package and each IC die may nevertheless be thermally coupled to a heat spreader with a plurality of solder TIM interconnects.

Although a number of structural features in exemplary assemblies are illustrated in FIG. 2A-2F, many other variations are possible. For example, an assembly having only one IC die or multiple IC die of substantially the same thickness may simplify solder TIM thermal interconnects such that the interconnect interfaces of a heat spreader need only have a single z-height or thickness, and/or the thermal interconnects need only have a single diameter. Notably, the assemblies depicted in FIG. 2A-2F may rely upon an IC die having particular thermal interconnect interface features and/or laminate structure. Alternatively, or in addition, the assemblies depicted in FIG. 2A-2F may rely upon a heat spreader having particular thermal interconnect interface features.

Figure 3A:
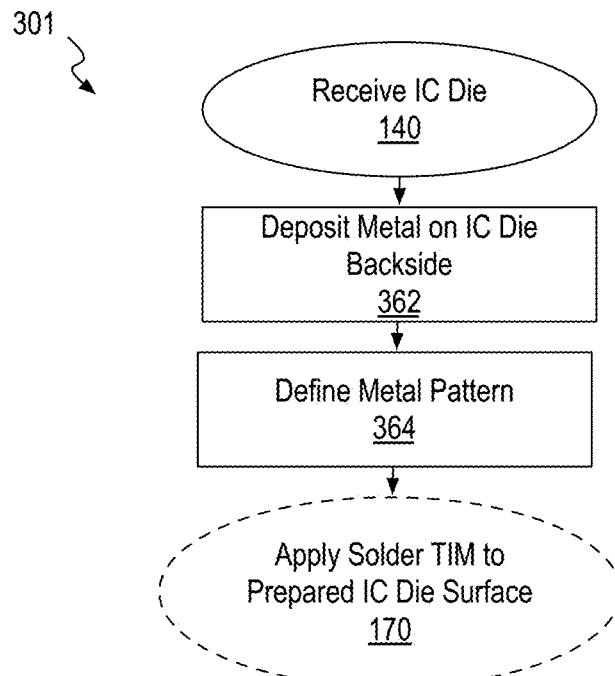
FIG. 3A is a flow diagram illustrating methods of fabricating thermal interconnect interface structures on an IC die surface, in accordance with some embodiments.

FIG. 3A is a flow diagram illustrating methods 301 for fabricating thermal interconnect interface structures on an IC die surface, in accordance with some embodiments. Methods 301 may be practiced, for example to fabricate an IC die suitable for integration into a package assembly including a heat spreader, such as any of the assemblies illustrated in FIG. 2A-2F. Notably, methods 301 may be practiced upon an IC die that is either in wafer/panel format or that has been assembled into a package. Methods 301 begin with receiving the IC die at input 140. In exemplary embodiments, the IC die has a thickness between 50 µm and 500 µm. At block 362, a metal is deposited on a back side of the IC die. The metal may be deposited directly on a crystalline substrate material (e.g., single crystal silicon) of the IC die, or directly on a thin film (e.g., <500 nm thickness) dielectric material on the crystalline substrate material, which may improve adhesion to the crystalline substrate material (e.g., SiN). Metal may be deposited with any technique suitable for the composition and thickness of metal desired. In some exemplary embodiments, a metal is deposited by sputter deposition (PVD). In some embodiments, a metal is deposited by electroless or electrolytic deposition. More than one deposition technique may be employed at block 362, for example a seed layer may be deposited by PVD and the seed layer employed to deposit additional metal by electroplating. In the example further illustrated in FIG. 4A, a metal 231 is deposited over a back side of IC die 205, opposite front side 415. Front side 415 may be supported by a carrier or may be attached through first-level electrical interconnects to a package substrate. As noted above, metal 231 is solderable. In some embodiments, metal 231 is copper. In other embodiments metal 231 is one of W, Co, or Ru. Metal 231 may have multiple layers, for example having a solderable surface finish (e.g., Ni or Au). Metal 231 is deposited to a thickness T1, which in some embodiments is less than 100 µm, and may be advantageously as thin as 15-25 µm.

Returning to FIG. 3A, methods 301 continue with the definition of a metal pattern at block 364. The metal pattern may either be subtractively defined by removing some of the metal deposited at block 362, or additively defined by depositing additional material over the metal deposited at block 362. In the example further illustrated in FIG. 4A, metal 231 has been removed to form discrete thermal interconnect interface structures 230. In some embodiments, thermal interconnect interface structures 230 are subtractively defined by ablating some of the metal 231 with a laser.

Figure 4A:
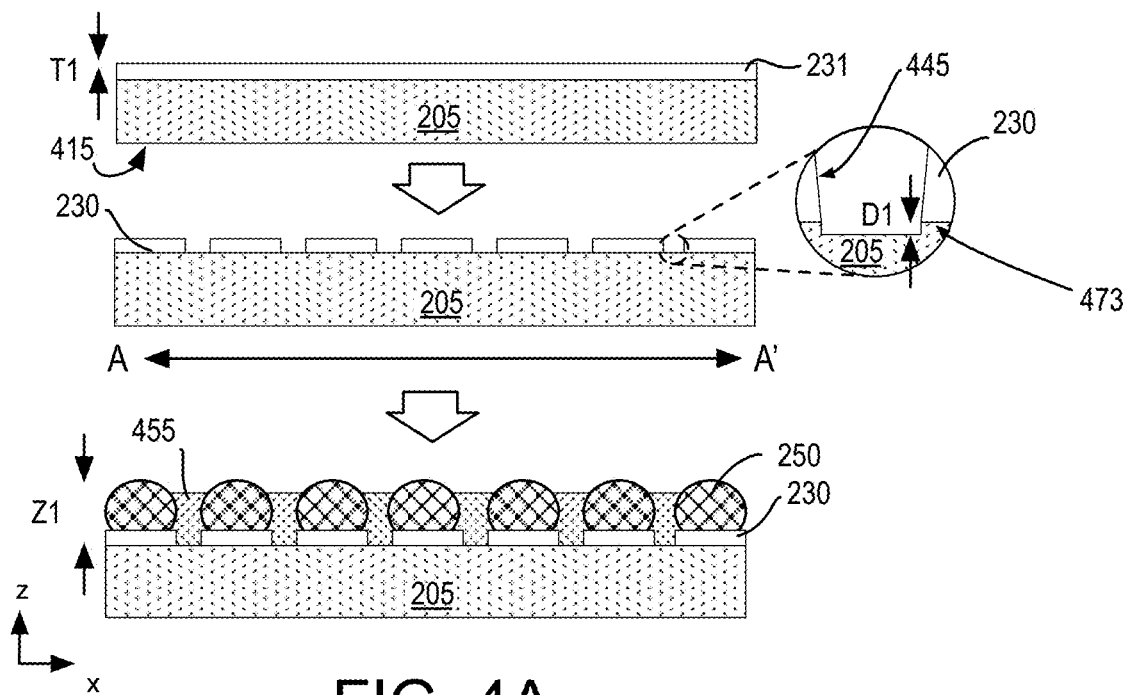
FIG. 4A illustrates cross-sectional views of thermal interconnect interface structures evolving during the practice of the methods in FIG. 3A and FIG. 3B, in accordance with some embodiments.
Figure 4B:
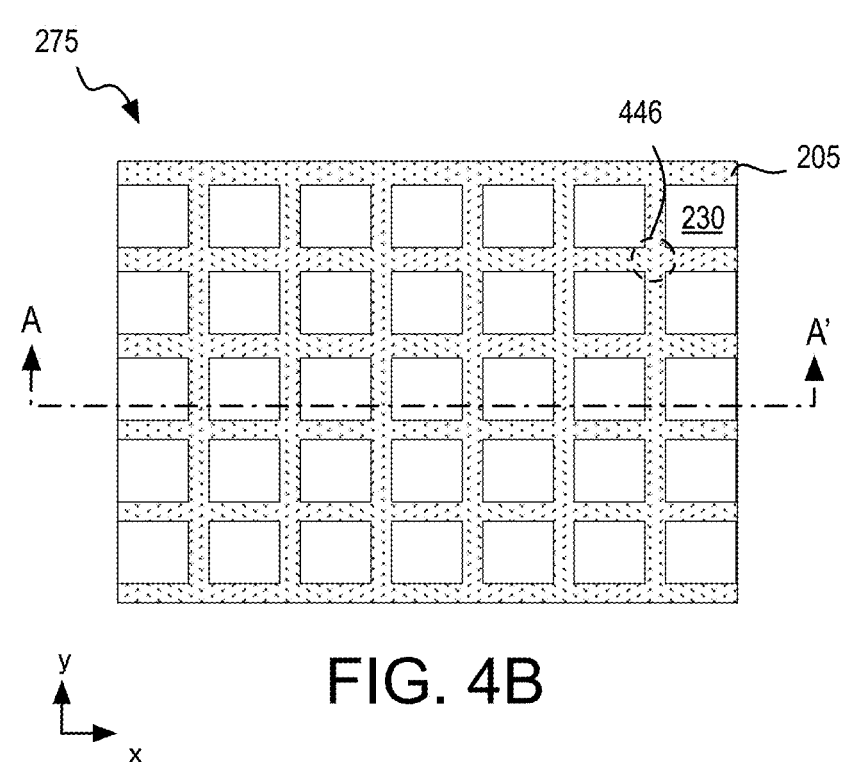
FIG. 4B illustrates a plan view of thermal interconnect interface structures on an IC die surface, in accordance with some embodiments.

FIG. 4B illustrates a plan view of thermal interconnect interface structures on an IC die surface, in accordance with some embodiments. For reference, the A-A' line of the cross-sectional view in FIG. 4A is denoted in FIG. 4B. As shown in FIGS. 4A and 4B, a contiguous groove or a plurality of intersecting grooves may be formed by laser ablation of metal 231, exposing the backside material of IC die 205. A $CO_2$ or Nd:YAG laser may be employed as a laser source, for example. As shown in FIG. 4A, laser grooving of predetermined areas of metal 231 may render structures 230 that have a positively sloped sidewall 445, with a bottom of the groove having a smaller lateral dimension than a top of the groove. Laser grooving may also recess the back side material of IC die 205, for example forming a recess in crystalline silicon of depth D1 below an interface 473 between an adjacent interface structure 230 and IC die 205. Depth D1 may vary with laser parameters, but is significantly greater than the minimal (e.g. nanometer) recess depths associated with a more selective (chemical) etching process. In some embodiments the depth D1 is a 5-10 µm, or more. As shown in FIG. 4B, laser ablating intersecting grooves having a transverse width of 25-100 µm may form a groove intersection point 446 having an area of about 25-100 $\mu m^2$ where ablation time is greatest (e.g., $2x$ that outside of intersection point 446). Such ablation path overlap regions may have a greater recess depth D1. FIG. 4B illustrates an exemplary spatial arrangement of interface structures 230 that fall on a 2D grid of a fixed pitch (e.g., comprising a 25-100 µm space and a 200-1000 µm land). However, any spatial arrangement is possible.

Although laser grooving may be particularly advantageous as no masking is required and it is a high throughput, low cost process, other subtractive patterning techniques may also be employed. For example where an etchant is available for metal 231, a lithographically defined mask may be formed over metal 231, and metal 231 then etched according to the mask pattern to arrive at interface structures 230 (e.g., with an isotropically curved sidewall profile and/or a reduced recess depth D1).

Figure 3B:
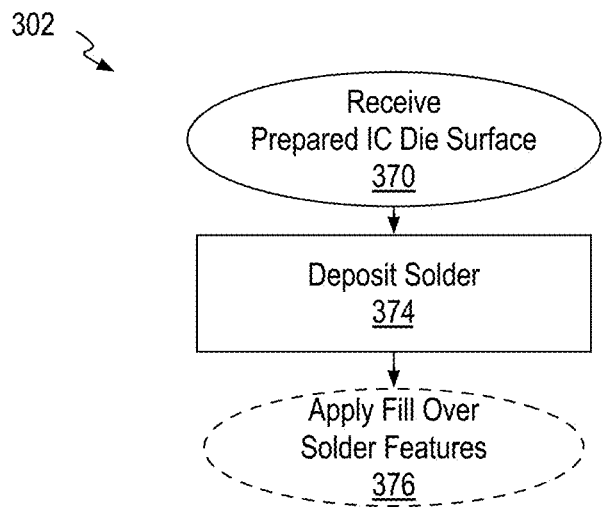
FIG. 3B is a flow diagram illustrating methods of applying solder TIM to thermal interconnect interface structures on an IC die surface, in accordance with some embodiments.

Returning to FIG. 3A, at this point in methods 301 an IC die may be substantially ready for assembly with a heat spreader. During such assembly, solder TIM thermal interconnects may be applied to interface structures 230. As described further below, the solder TIM thermal interconnects may be provided as pre-applied subcomponents of a heat spreader sub-assembly. Alternatively, methods 301 may be completed at output 170 with the further application of solder TIM thermal interconnects to further prepare the IC die for assembly with a heat spreader. In FIG. 3A, output 170 is denoted in dash line to emphasize solder TIM need not be applied in all embodiments of methods 301. In some embodiments, methods 302 (FIG. 3B) are practiced to apply solder TIM thermal interconnects to a prepared IC die surface. Methods 302 begin with receiving an IC die having a surface that has been prepared, for example, according to methods 301. At block 374, individual solder features are deposited upon individual ones of the interface structures. Optionally, methods 302 may further include the deposition of a dielectric material as underfill/overfill that at least partially backfills spaces between adjacent solder features.

In the example illustrated in FIG. 4A, a feature (e.g., microbump) of solder is formed on each interface structure 230 as a solder TIM thermal interconnects 250. Solder feature dimensions may be predetermined to arrive at a desired z-height Z1 from the back side of IC die 205. In some embodiments, where solder TIM thermal interconnects 250 are 50-100 μm, z-height Z1 may be 75-125 μm, for example. Solder features may be formed according to any technique known to be suitable for front side IC die electrical interconnects. With the solder TIM thermal interconnects 250 distributed or arrayed over the area of IC die 205, an underfill material 455 may be applied between individual ones of the solder TIM thermal interconnects 250. Underfill material 455 may have any composition known to be suitable for solder feature underfill applications (e.g., polymer dielectrics).

Figure 5A:
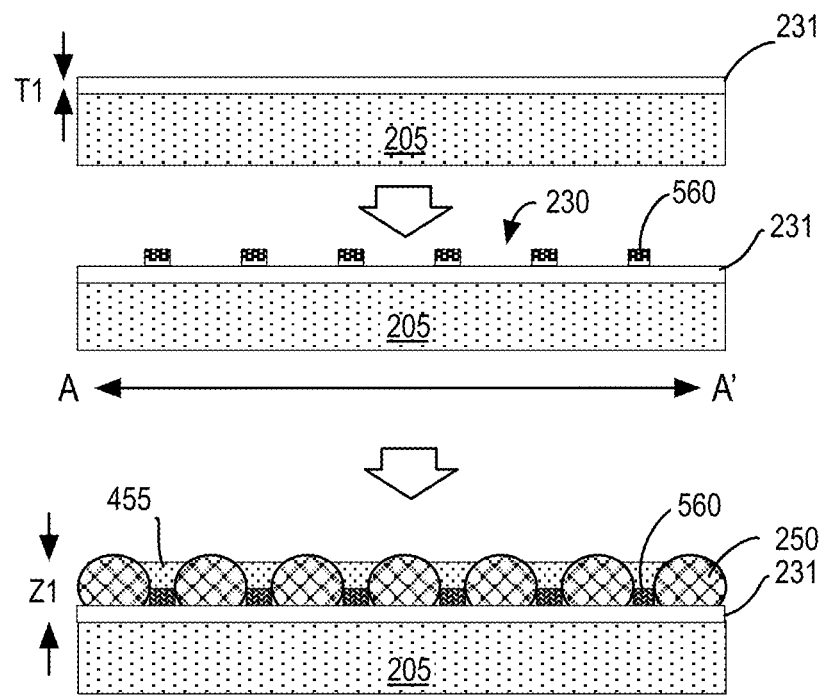
FIG. 5A illustrates cross-sectional views of thermal interconnect interface structures evolving during the practice of the methods in FIG. 3A and FIG. 3B, in accordance with some alternative embodiments.
Figure 5B:
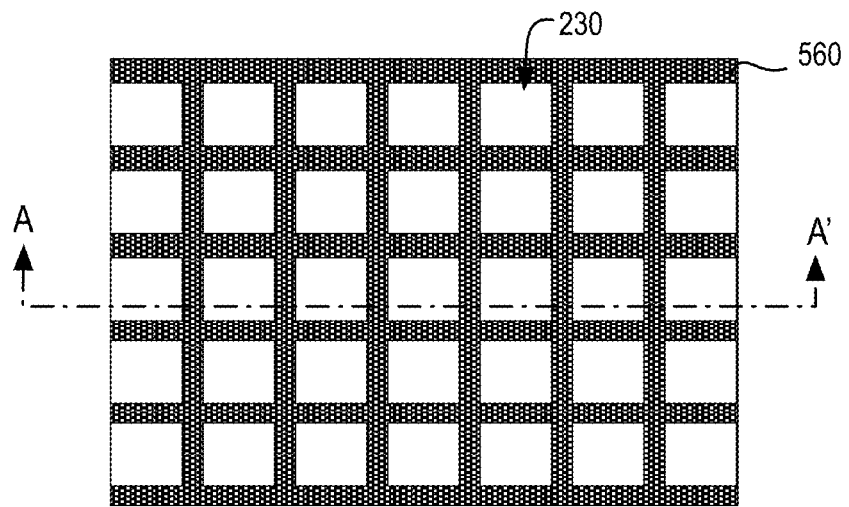
FIG. 5B illustrates a plan view of thermal interconnect interface structures on an IC die surface, in accordance with some alternative embodiments.

FIG. 5A illustrates cross-sectional views of thermal interconnect interface structures evolving during the practice of the methods in 301 and 302, in accordance with some exemplary additive embodiments. As shown in FIG. 5A, a mask material 560 is applied over the metal deposited at block 362 (FIG. 3A), and mask material 560 defines a negative pattern between discrete thermal interconnect interface structures 230. Mask material 560 may be a solder resist and/or printed as an ink, for example. FIG. 5B illustrates a plan view of thermal interconnect interface structures on an IC die surface, in accordance with some embodiments. For reference, the A-A' line of the cross-sectional view in FIG. 5A is depicted in FIG. 5B. Although FIG. 5B illustrates an exemplary spatial arrangement of interface structures 230 that fall on a 2D grid of a fixed pitch, any spatial arrangement is possible.

In the example illustrated in FIG. 5A, a feature of solder (e.g., microbump) is formed on each interface structure 230 as individual solder TIM thermal interconnects 250. Solder feature dimensions may be predetermined to arrive at z-height Z1, which may be 75-125 μm, or less, for example. Optionally, underfill material 455 may be applied between individual ones of the solder TIM thermal interconnects 250.

Figure 6:
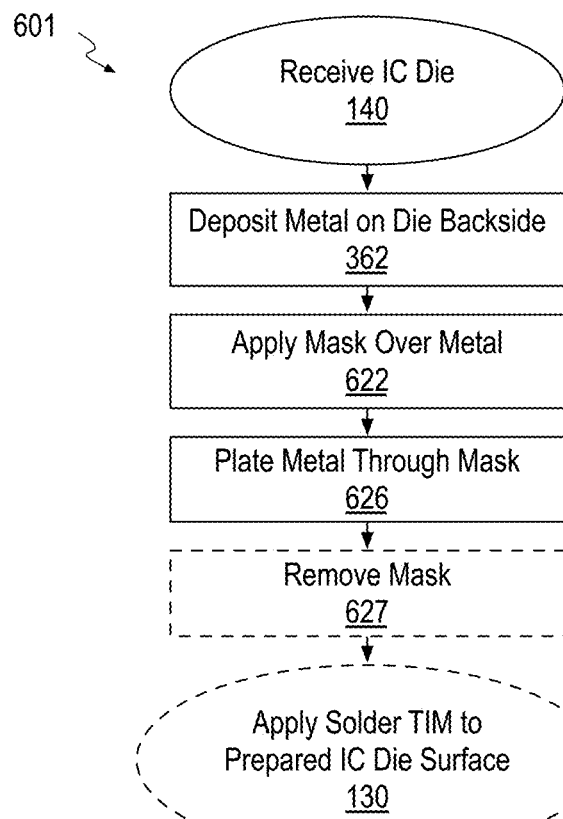
FIG. 6 is a flow diagram illustrating methods of fabricating thermal interconnect interface structures on an IC die, in accordance with some alternative embodiments.

FIG. 6 is a flow diagram illustrating methods 601 for fabricating thermal interconnect interface structures on an IC die, in accordance with some alternative additive embodiments. Methods 601 again begin at input 140 where an IC die is received. At block 362, metal (e.g., Cu) is deposited on the back side of the IC die. A plating mask material is then applied over the metal at block 622 and then, at block 626, additional metal (e.g., Cu) is then plated up through the plating mask openings where the underlying metal was exposed. At block 627, the plating mask is removed and, if desired, solder TIM is applied to the plated interface structures at output 130.

Figure 7:
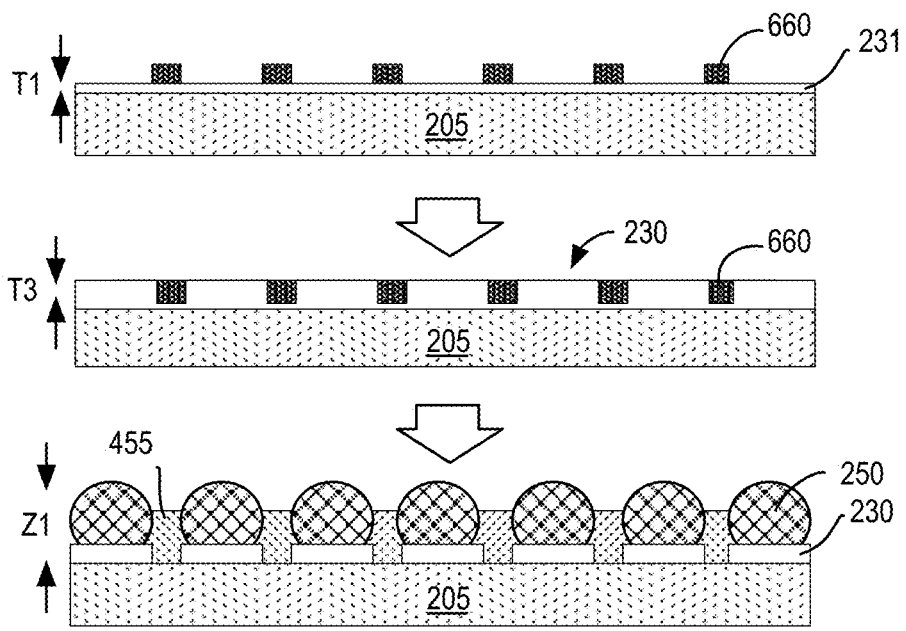
FIG. 7 illustrates cross-sectional views of thermal interconnect interface structures evolving during the practice of the methods in FIG. 6, in accordance with some alternative embodiments.

FIG. 7 illustrates cross-sectional views of thermal interconnect interface structures evolving during the practice of methods 601, in accordance with some embodiments. In this example, metal 231 has been deposited on the back side of IC die 205, for example in direct contact with a crystalline substrate material. As described above, metal 231 is deposited to any suitable thickness T1. In some exemplary embodiments, metal 231 is sputter deposited as a seed layer, and may, for example comprise copper. A patterned plating mask 660 is formed over metal 231 and metal electroplated up to thickness T3 within unmasked regions of metal 231. Plating mask 660 may then be removed (although it may be permanently retained in alternative embodiments), and a flash etch of metal 231 performed to define discrete thermal interconnect interface features (lands) 230. In the example illustrated in FIG. 7, a feature of solder (e.g., microbump) is formed on each interface structure 230 as individual solder TIM thermal interconnects 250. Solder feature dimensions may be predetermined to arrive at z-height Z1, which again may be 75-125 μm, or less, for example. Optionally, underfill material 455 may be applied between individual ones of the solder TIM thermal interconnects 250.

Figure 8A:
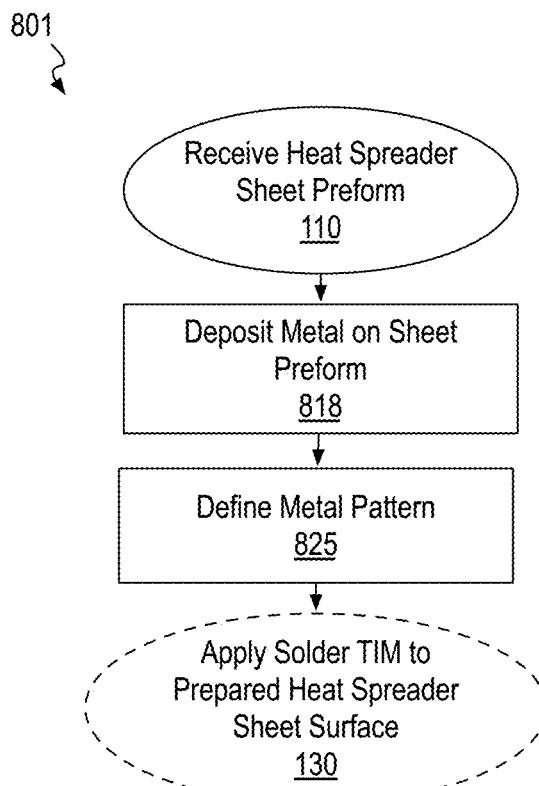
FIG. 8A is a flow diagram illustrating methods of fabricating thermal interconnect interface structures on a heat spreader sheet, in accordance with some embodiments.

FIG. 8A is a flow diagram illustrating methods 801 for fabricating thermal interconnect interface structures on a heat spreader sheet, in accordance with some embodiments. Methods 801 begin with receiving a heat spreader sheet preform at input 110. The sheet preform may be very thin, for example in the range of 15-25 μm, and temporarily attached to any carrier suitable for providing mechanical support during processing. The sheet preform may be any of the high thermal conductivity sheet materials introduced above, such as, but not limited to a pyrolytic graphite sheet, or a copper sheet. The sheet preform may be any size sufficient to spread heat at least over an area of an IC die, advantageously multiple IC die, and preferably beyond one or more edges of one or more IC die.

At block 818, a solderable metal is deposited on one or more surfaces of the sheet preform. The metal may be deposited directly on the sheet material (e.g., pyrolytic graphite). Metal may be deposited with any technique suitable for the composition and thickness of metal desired. In some exemplary embodiments, a metal is deposited by PVD. In some embodiments, a metal is deposited by electroless or electrolytic deposition. More than one deposition technique may be employed at block 818, for example a seed layer may be deposited by PVD and the seed layer employed to deposit additional metal by electroplating. Following deposition of metal at block 818, the heat spreader has a laminate structure comprising the sheet material preform and at least one layer of metal on one or both sides of the sheet material.

Figure 8B:
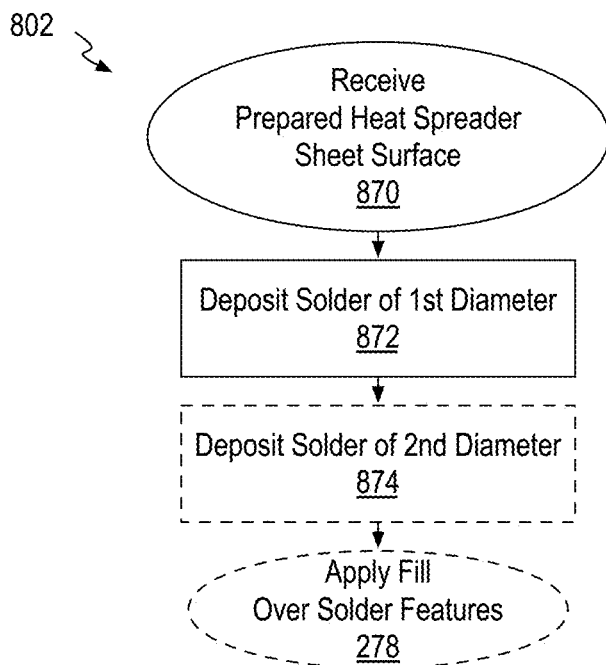
FIG. 8B is a flow diagram illustrating methods of applying solder array TIM to thermal interconnect interface structures on a heat spreader, in accordance with some embodiments.

Methods 801 continue at block 825 where a pattern comprising a plurality of solderable surfaces or structures is defined on at least one side of the composite heat spreader sheet. Similar to the techniques described above for preparing a back side of an IC die, the metal pattern may either be subtractively defined by removing some of the metal deposited at block 818, or additively defined by depositing additional material over the metal deposited at block 818. Once patterned, a heat spreader may be substantially ready for assembly with an IC die. During such assembly, solder TIM thermal interconnects may be applied to the interface structures defined at block 825. As described above, the solder TIM thermal interconnects may be provided as subcomponents of an IC die sub-assembly. Alternatively, methods 801 may be completed at output 130 with the application of solder TIM thermal interconnects to further prepare the heat spreader for assembly with one or more IC die. In FIG. 8A, output 130 is denoted in dash line to emphasize solder TIM need not be applied in all embodiments of methods 801. In some embodiments, methods 802 (FIG. 8B) are practiced to apply solder TIM thermal interconnects to a prepared heat spreader surface. Methods 802 begin at input 870 where a heat spreader with a prepared surface (e.g., according to methods 801) is received. At block 872, individual solder features are deposited upon individual ones of the heat spreader interface structures. Solder features may be dimensioned to be some minimal size (e.g., 50-100 μm) for best thermal performance. For embodiments where a heat spreader is to be thermally coupled with multiple IC die, and a difference in z-height between the IC die is to be at least partially accommodated by the solder features, additional solder features of a different size may be further deposited on a subset of the heat spreader interface structures at block 874. As another option, methods 802 may further include the deposition of a dielectric material as underfill/overfill that at least partially backfills spaces between the solder features.

Figure 9A:
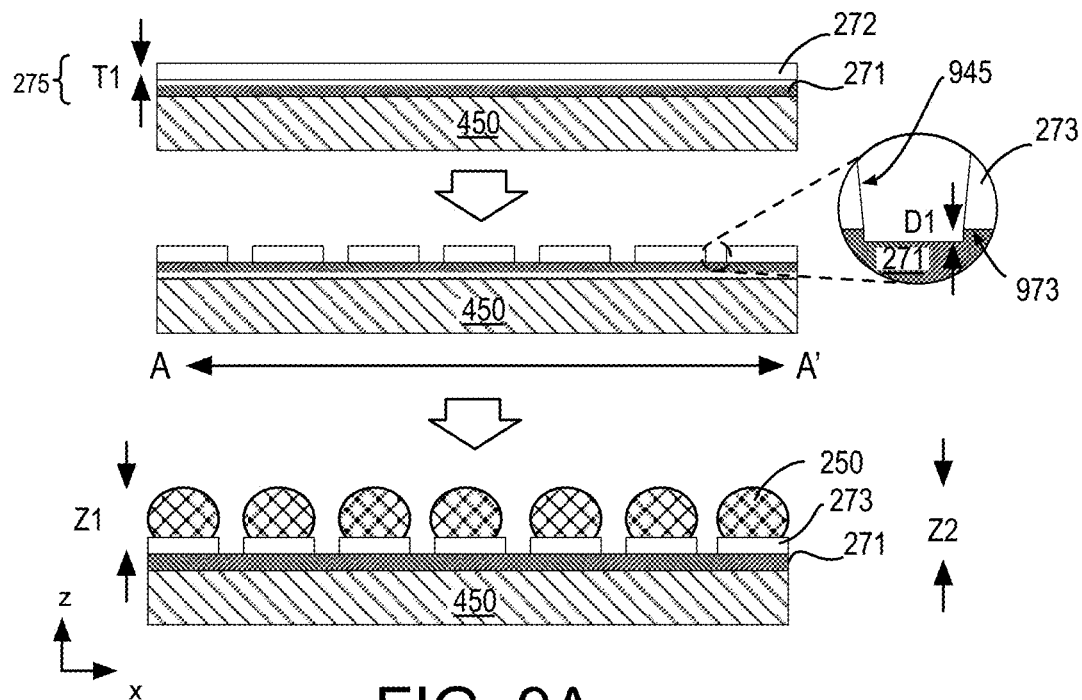
FIG. 9A illustrates cross-sectional views of thermal interconnect interface structures evolving during the practice of the methods in FIG. 8A and FIG. 8B, in accordance with some embodiments.

FIG. 9A illustrates cross-sectional views of thermal interconnect interface structures evolving during the practice of the methods 801 and 802, in accordance with some embodiments. As shown, sheet material 271 is supported by a temporary carrier 450. In this example, metal 272 is deposited on the exposed side of sheet material 271. In other embodiments, a carrier transfer may be performed or a core plating process may be practiced to deposit metal on both sides of sheet material 271. As further shown in FIG. 9A, metal 272 has been selectively removed to form discrete thermal interconnect interface structures 273. In some embodiments, thermal interconnect interface structures 273 are subtractively defined by ablating some of the metal 272 with a laser. Alternatively, any etch process suitable for metal 272 may be used to define interface structures 273.

Figure 9B:
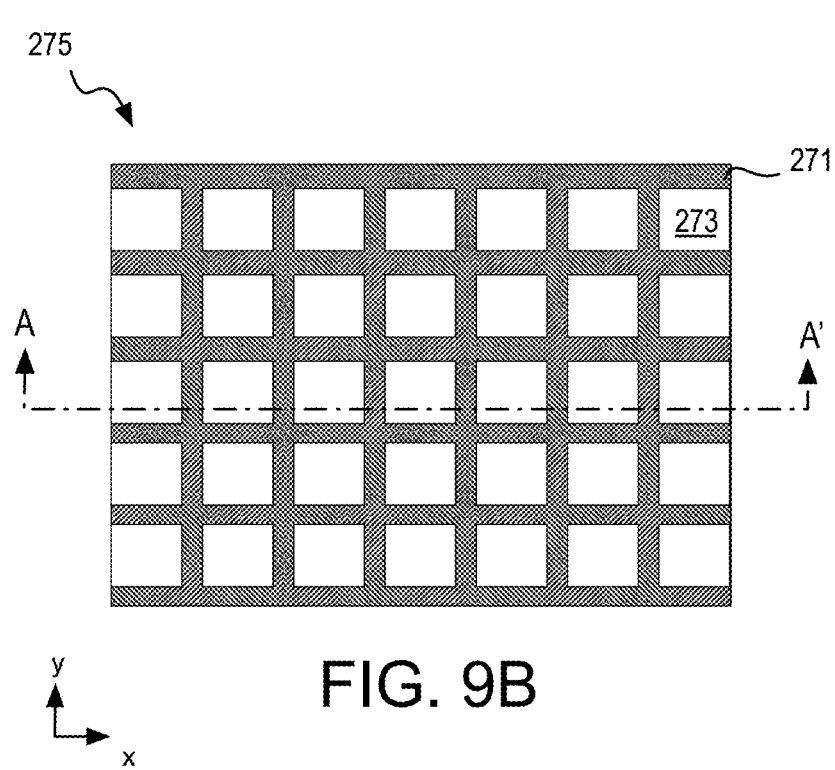
FIG. 9B illustrates a plan view of thermal interconnect interface structures on a heat spreader, in accordance with some embodiments.

FIG. 9B illustrates a plan view of thermal interconnect interface structures on a heat spreader surface, in accordance with some embodiments. For reference, the A-A' line of the cross-sectional view in FIG. 9A is depicted in FIG. 9B. As shown in FIGS. 9A and 9B, a contiguous groove or a plurality of intersecting grooves may be formed by laser ablation of metal 272, exposing sheet material 271 at a bottom of the grooves. As shown in FIG. 9A, laser grooving of predetermined areas of metal 272 may result in structures 273 having a positively sloped sidewall 445, for example where a bottom of the groove has a smaller lateral dimension than a top of the groove. Laser grooving may also recess sheet material 271, for example forming a recess of depth D1 below an interface 973 between an adjacent interface structure 273 and sheet material 271. As shown in FIG. 9B, laser ablating intersecting grooves having a transverse width of 25-100 μm may form a groove intersection points having an area of about 25-100 μm² where ablation time is greatest (e.g., 2x that outside of intersection point). Such ablation path overlap regions may have a greater recess depth D1. FIG. 9B illustrates an exemplary spatial arrangement of interface structures 273 that fall on a 2D grid of a fixed pitch (e.g., comprising a 25-100 μm space and a 200-1000 μm land). However, any spatial arrangement is possible. Although laser grooving may be particularly advantageous, other subtractive patterning techniques may also be employed. For example where an etchant is available for metal 272, a lithographically defined mask may be formed over metal 272, and metal 272 then etched according to the mask pattern to arrive at interface structures 273 (e.g., with an isotropically curved sidewall profile and/or a minimal recess depth D1).

In the example further illustrated in FIG. 9A, a feature (e.g., microbump) of solder is formed on each interface structure 273 as a solder TIM thermal interconnects 250. Solder feature dimensions may be predetermined to arrive at a desired z-height Z1 from the surface of sheet material 271. In some embodiments, where solder TIM thermal interconnects 250 are 50-100 μm, z-height Z1 may be 75-125 μm, for example. With the solder TIM thermal interconnects 250 distributed or arrayed over the area of heat spreader 275, any suitable underfill material (not depicted) may be applied between individual ones of the solder TIM thermal interconnects 250. Noting that underfill material (e.g., polymer dielectrics) may lose advantageous properties over time, underfill material need not be applied as part of a heat spreader solder TIM assembly, and instead applied during assembly of the heat spreader with an IC device package.

Figure 10A:
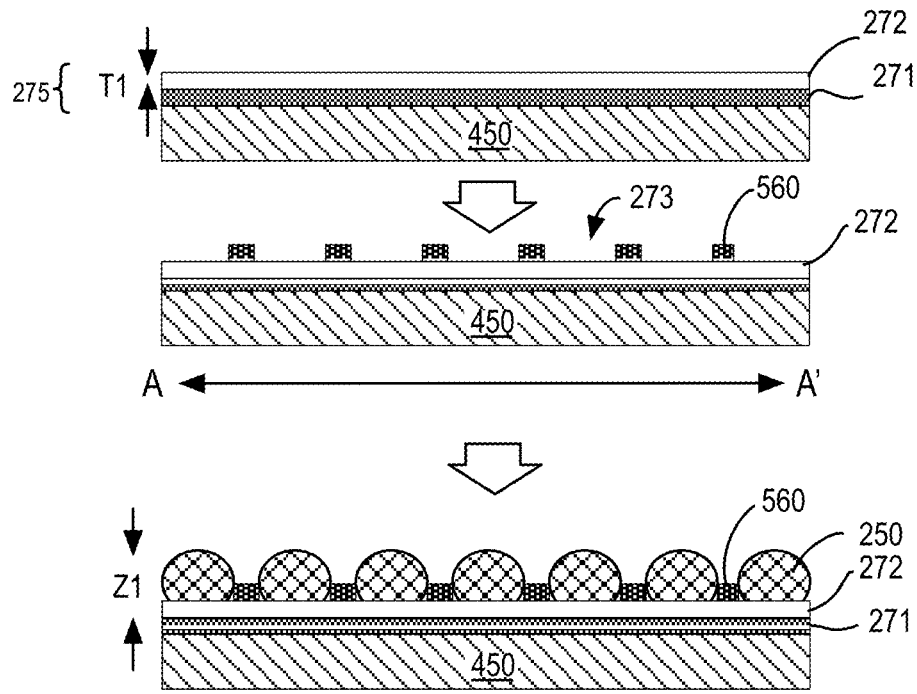
FIG. 10A illustrates cross-sectional views of thermal interconnect interface structures evolving during the practice of the methods in FIG. 8A and FIG. 8B, in accordance with some alternative embodiments.
Figure 10B:
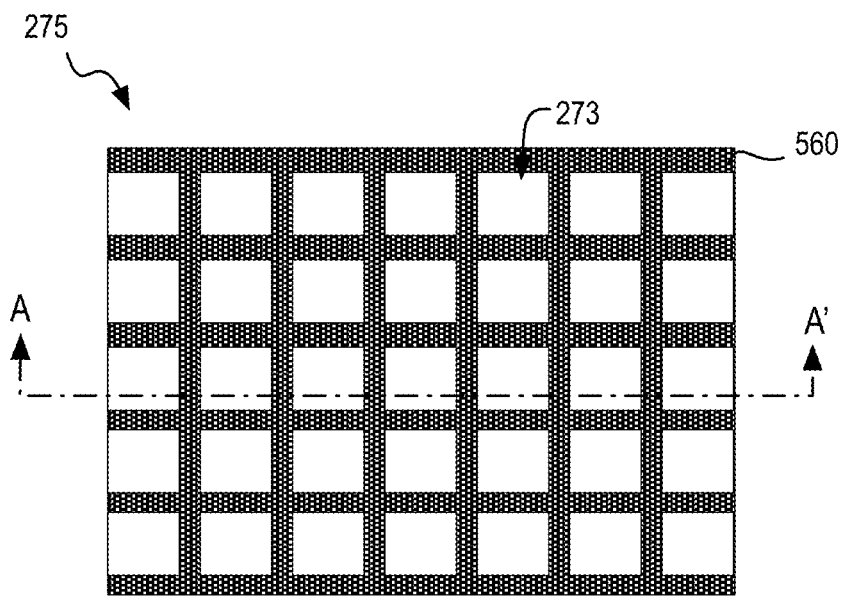
FIG. 10B illustrates a plan view of thermal interconnect interface structures on a heat spreader, in accordance with some alternative embodiments.

FIG. 10A illustrates cross-sectional views of thermal interconnect interface structures evolving during the practice of the methods 801 and 802, in accordance with some additive patterning embodiments. As shown in FIG. 10A, a mask material 560 is applied over metal 272, and mask material 560 defines a negative pattern between discrete thermal interconnect interface structures 273. Mask material 560 may be a solder resist and/or printed as an ink, for example. FIG. 10B illustrates a plan view of thermal interconnect interface structures on an IC die surface, in accordance with some embodiments. For reference, the A-A' line of the cross-sectional view in FIG. 10A is depicted in FIG. 10B. Although FIG. 10B illustrates an exemplary spatial arrangement of interface structures 273 that fall on a 2D grid of a fixed pitch, any spatial arrangement is possible. As further shown in FIG. 10, solder features may be deposited on corresponding ones of interface structures 273 to integrate thermal interconnects 250 into a heat spreader assembly in accordance with some embodiments.

Figure 11:
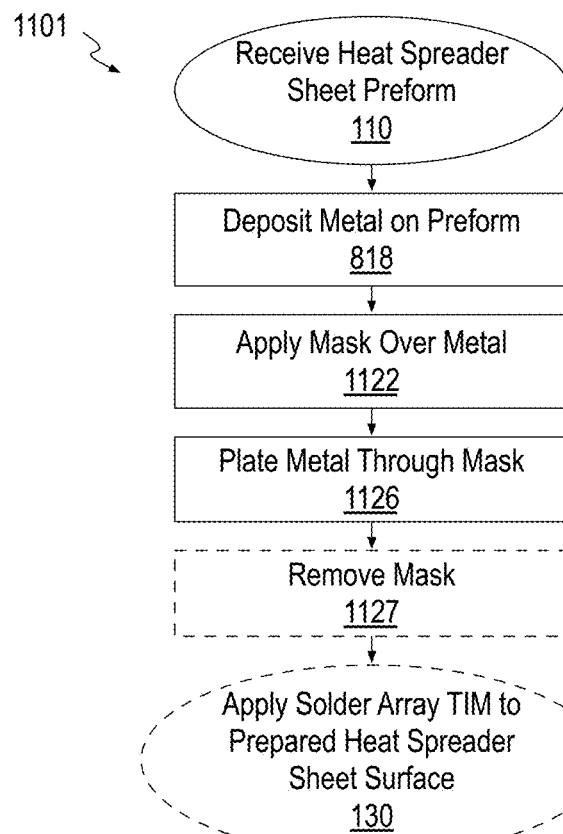
FIG. 11 is a flow diagram illustrating methods of fabricating thermal interconnect interface structures on a heat spreader, in accordance with some alternative embodiments.

FIG. 11 is a flow diagram illustrating methods 1101 for fabricating thermal interconnect interface structures on a heat spreader, in accordance with some alternative additive embodiments. Methods 1101 again begin at input 110 where a sheet material preform is received. At block 818, metal (e.g., Cu) is deposited on a side of the sheet material. A plating mask material is then applied over the metal at block 1122, and at block 1126 additional metal (e.g., Cu) is then plated up through the plating mask openings where the underlying metal was exposed. At block 1127, the plating mask may be removed and, if desired, solder TIM is applied to the plated interface structures.

Figure 12A:
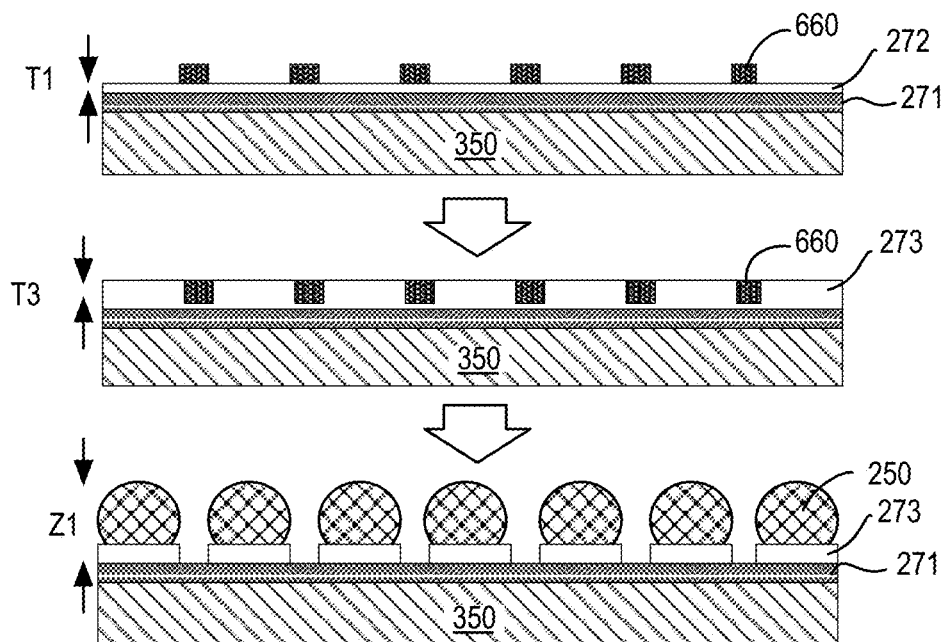
FIG. 12A illustrates cross-sectional views of thermal interconnect interface structures evolving during the practice of the methods in FIG. 11, in accordance with some embodiments.

FIG. 12A illustrates cross-sectional views of thermal interconnect interface structures evolving during the practice of methods 1101, in accordance with some embodiments. In this example, metal 272 has been deposited on sheet material 271 (e.g., in direct contact with a graphite sheet). As described above, metal 272 is deposited to any suitable thickness T1. In some exemplary embodiments, metal 272 is sputter deposited as a seed layer, and may, for example comprise copper. A patterned plating mask 660 is formed over metal 272 and metal electroplated up to thickness T3 within unmasked regions of metal 272. Plating mask 660 may then be removed (although it may be permanently retained in alternative embodiments), and a flash etch of metal 272 performed to define discrete thermal interconnect interface features (lands) 273. In the example illustrated in FIG. 12A, a feature of solder (e.g., microbump) is formed on each interface structure 273 as individual solder TIM thermal interconnects 250. Solder feature dimensions may be predetermined to arrive at z-height Z1, which again may be 75-125 μm, for example. Optionally, an underfill material (not depicted) may be applied between individual ones of the solder TIM thermal interconnects 250.

Figure 12B:
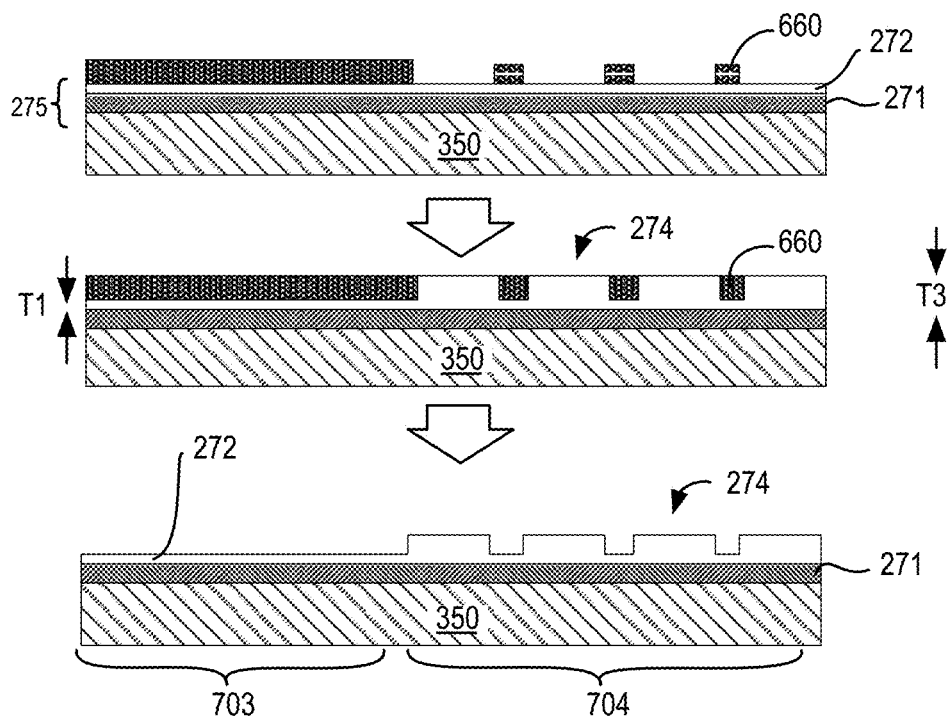
FIG. 12B illustrates cross-sectional views of thermal interconnect interface structures evolving during the practice of the methods in FIG. 11, in accordance with some alternative embodiments.

FIG. 12B illustrates cross-sectional views of thermal interconnect interface structures evolving during the practice of the methods 1100, in accordance with some alternative embodiments where a thickness of interface structures is varied between region 703 and region 704 of a heat spreader. The interface structure thickness variation between regions 703 and 704 may accommodate IC die of different die thicknesses, for example. As shown in FIG. 12B, plating mask 660 is applied over metal 272. The plating mask pattern within a region 704 includes openings where metal 272 is exposed. The plating mask pattern within region 703 includes substantially no openings where metal 272 is exposed. Additional metal may be plated within the mask openings increasing the thickness of interface structures 274 within region 704 to a thickness T3. Upon removing the plating mask, metal 272 of thickness T1 remains in regions where no metal was plated. If desired, another mask material (e.g., solder resist or dielectric ink, etc. may be applied over metal 272 to define another plurality of interface structures (not depicted). The difference between thicknesses T1 and T3 may be as much as 500 μm, for example, which may fully accommodate a difference in IC die thicknesses. Alternatively, the difference between thicknesses T1 and T3 may be somewhat less than a difference in IC die thickness, and only partially accommodate the IC die thickness difference. For such embodiments, a remainder of the difference in IC die thickness be accommodated either by a difference in TIM solder feature dimensions, and/or a difference in thickness in thermal interconnect interface structures on the different IC die.

Figure 13:
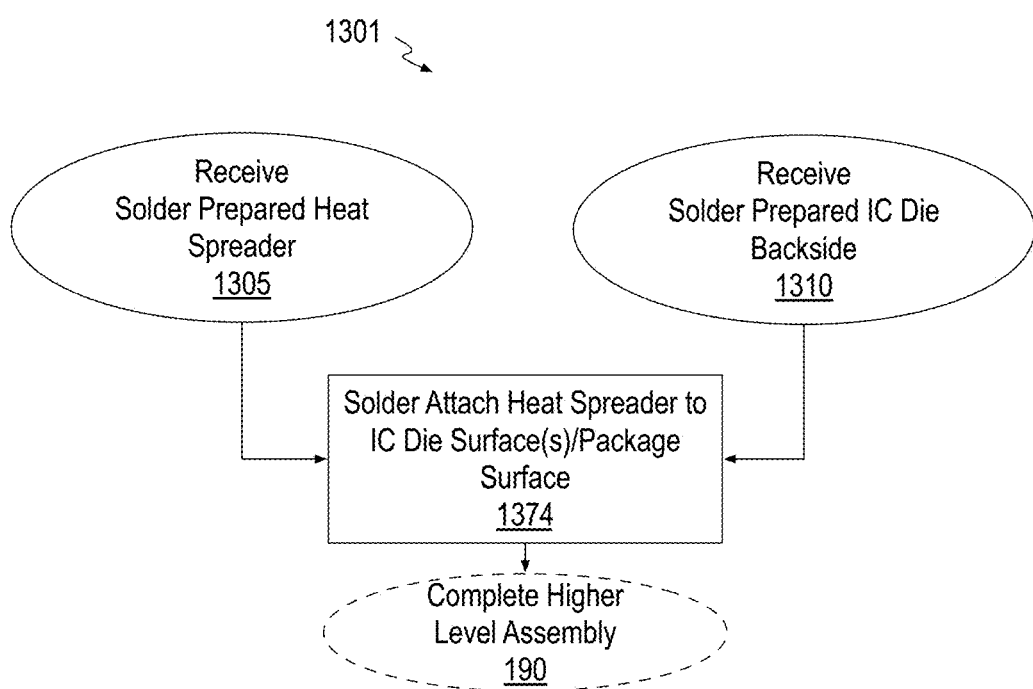
FIG. 13 is a flow diagram illustrating methods of assembly a heat spreader and an IC die with a solder array TIM, in accordance with some alternative embodiments.

In some embodiments, assembly of a solder prepared IC die and a solder prepared heat spreader surface proceeds according to methods 1301, as shown in FIG. 13. In methods 1301, a solderable or "solder prepared" heat spreader is received at input 1305. The solderable heat spreader may have any of the features described above and/or may have been prepared according to any of the methods described above. Alternatively, another heat spreader having a surface suitable for being thermally coupled to an IC die by a plurality of solder TIM interconnect may be received. At block 1310, one or more solderable or "solder prepared" IC die is received at input 1310. The solderable IC die may have any of the features described above and/or may have been prepared according to any of the methods described above. Alternatively, another IC die having a surface suitable for being thermally coupled to a heat spreader by a plurality of solder TIM interconnect may be received.

Methods 1301 continue at block 1374 where the solderable surface of the heat spreader is solder attached to the solderable surface of the IC die. Any technique(s) may be practiced at block 1374. In some embodiments, a heat spreader is pick-and-placed upon a target IC die, and a thermo-compression process performed to melt and bond the solder interconnect to both the solderable surfaces. In accordance with advantageous embodiments, at least one of the solderable surface includes a plurality of interface structures or lands, for example as described above, which maintain a desired spatial distribution of the plurality of thermal interconnects. Methods 1301 complete at output 190 where any higher level assembly may be performed. For example at output 190, a package coupled to a side of the IC die opposite the heat spreader may be electrically coupled to a host component. Alternatively, or additionally, a system-level thermal solution may be coupled to a side of the heat spreader opposite the IC die.

Figure 14A:
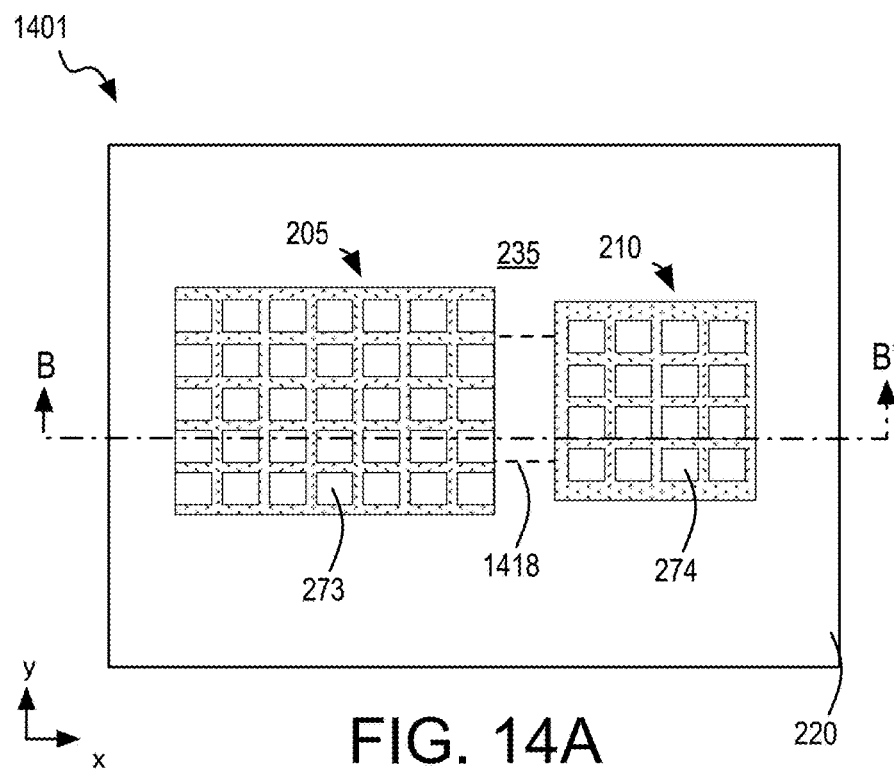
FIG. 14A is a plan view of thermal interconnect interface structures on a surface of an IC die assembly, in accordance with some embodiments.

FIG. 14A is a plan view of thermal interconnect interface structures on the surface of an IC die assembly 1401, in accordance with some embodiments. IC die assembly 1401 includes IC die 205 and 210 flip-chip bonded to a surface of package substrate 220. Package substrate 220 further includes an embedded IC 1418 denoted in dashed line as being below a plane of IC die 205 and 210. Thermal interconnect surface interface structures 273 are distributed over the back side of IC die 205. Thermal interconnect surface interface structures 274 are distributed over the back side of IC die 210. IC die assembly 1401 is a multi-chip package that may be received, for example, from a chip manufacturer. IC die assembly 1401 may have been received substantially as illustrated, or a system assembler may have formed interface structures 273 and 274 in-situ upon IC die assembly 1401 (e.g., by laser scribing a backside metal provided on each of IC die 205 and 210).

Figure 14B:
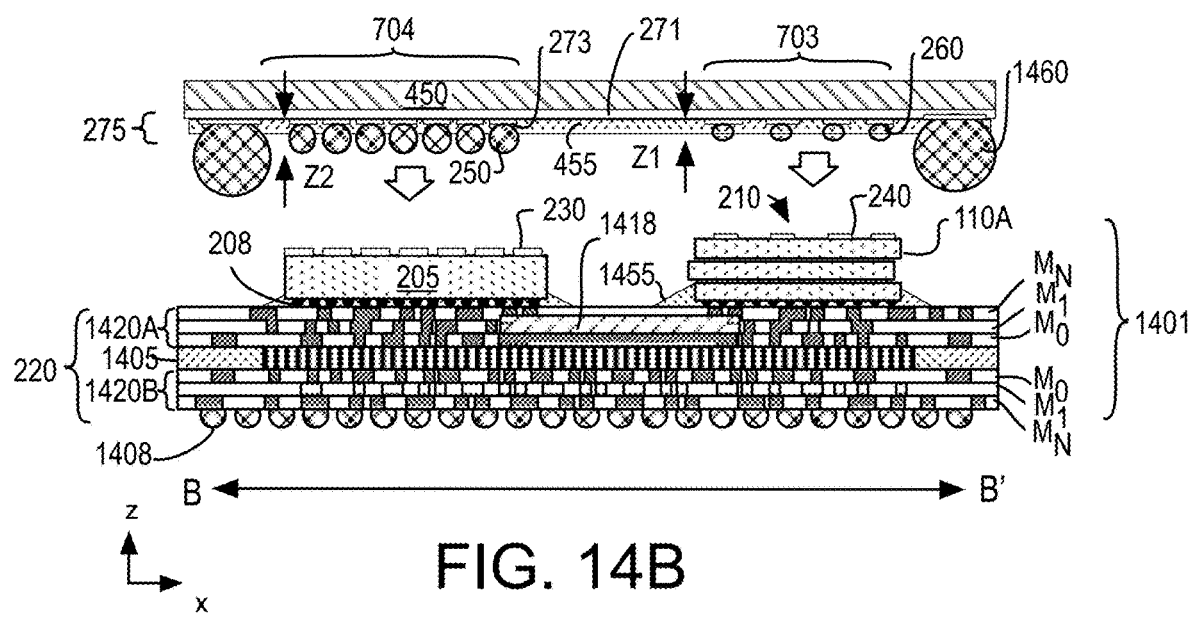
FIG. 14B illustrates cross-sectional views of thermal interconnect interface structures being joined by a solder array TIM during the practice of the methods in FIG. 13, in accordance with some embodiments.

FIG. 14B illustrates cross-sectional views of thermal interconnect interface structures being joined by a plurality of solder TIM thermal interconnects during the practice of the methods 1301 (FIG. 13), in accordance with some embodiments where the solder TIM thermal interconnects are provided as a component of a heat spreader sub-assembly. The cross-sectional view depicted in FIG. 14B is along the B-B' line demarked in FIG. 14A.

As shown in FIG. 14B, package substrate 220 includes layers of package metallization between dielectric materials 1420A and 1420B. Package substrate metallization layers may comprise copper, other suitable metals, or other conductive materials electroplated or otherwise formed directly on dielectric material, for example after a given iteration of a lamination process. There may be any number of package metallization levels within the package substrate 220. The highest metallization level may be the Nth metallization level ($M_N$) at or nearest to a first (e.g., top) side of the package substrate 220. The Nth metallization level is over a base metallization level, metal zero ($M_0$), which is most distal from the first side of package substrate 220, and in the illustrated example in direct contact with core 1405. Any number of intermediate package metallization levels (e.g., $M_1$) may be between metallization levels $M_N$ and $M_0$. As shown in FIG. 14B, package substrate 220 is substantially symmetric about core 1405 with metallization levels $M_0$-$M_N$ also present on the second (e.g., bottom) side of package substrate 220. A metallization level (e.g., copper) may be sputtered, plated, or a foil may be laminated as a metallization level. Each metallization level $M_0$-$M_N$ may have a thickness of 5-50 microns, for example, and may be patterned to vertically route electrical communications through package substrate thickness (e.g., through dielectric materials 1420A, through core 1405, and through dielectric materials 1420B). For embodiments where metallization levels are plated, metallization features in each level may be formed by a semi-additive processing (SAP) where a plating mask may have been employed, or by a modified SAP (mSAP) where a foil is applied and a masked etch process (e.g., wet chemical) is employed.

As further illustrated if FIG. 14B, package substrate 220 is coupled to second level interconnects 1408, which may be solder balls or other solder features, for example. Package metallization level routing may therefore electrically couple second level interconnects 1408 to first-level interconnects 208. Some of first-level interconnects 208 coupled IC die 205 and 210 to IC 1418, embedded within package substrate 220. IC 1418 may include IC-scale metallization interconnecting IC die 205 to IC die 210 as a communication bridge between IC die 205 and IC die 210. An underfill material 1455 surrounds each of IC die 205 and 210. In the example illustrated, IC die 210 is actually a die-level integration comprising multiple IC die 210A. As such, the z-height of IC die 210 is significantly greater than the z-height of IC die 205.

Heat spreader 275, being handled via carrier 450 includes thermal interconnects 250 attached to interface structures 273 and thermal interconnects 260 attached to interface structures 274. Heat spreader region 704 is aligned over IC die 205 and heat spreader region 703 is aligned over IC die 210 so that thermal interconnects 260 having smaller z-height Z1 are joined with thermal interconnect interface structures 240 and thermal interconnects 250 having larger z-height Z2 are joined with thermal interconnect interface structures 230. Following joinder, heat spreader carrier 450 may be removed, for example through a UV assisted release process. In the illustrated example, the heat spreader sub-assembly includes underfill material 455 between thermal interconnects 250 and 260.

Notably, although heat spreader 275 may have primarily a thermal conductance function, it is not precluded from further serving some secondary electrical function, such as a ground plane and/or EMI shield, for example. Such embodiments are possible where heat spreader 275 includes a conductive layer. Heat spreader 275 may have sufficient electrical conductivity where sheet material 271 is PGS and/or includes one or more metal layers, for example. Heat spreader 275 may be electrically tied to a voltage potential of IC die assembly 1401, for example through solder balls 1460 located at a peripheral edge of heat spreader 275. Solder balls 1460 may be distributed about a perimeter, completely surrounding IC die 205, 210. Together, heat spreader 275 and solder balls 1460 may form an EMI shield or cage over and around IC die 205, 210.

Figure 14C:
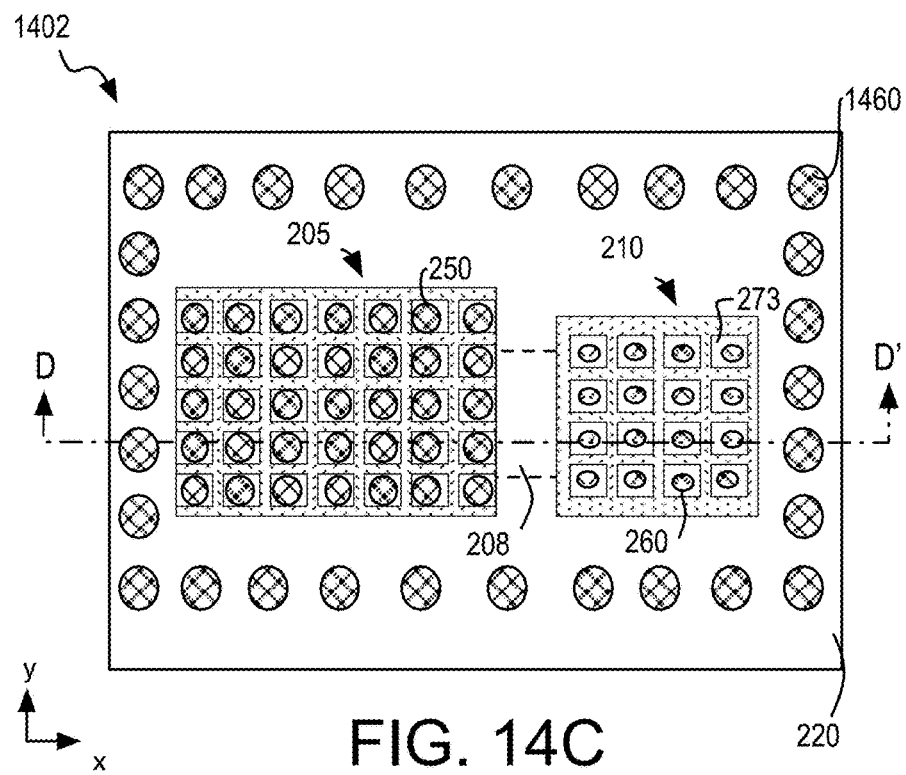
FIG. 14C is a plan view of thermal interconnects on thermal interconnect interface structures of an IC die assembly, in accordance with some alternative embodiments.
Figure 14D:
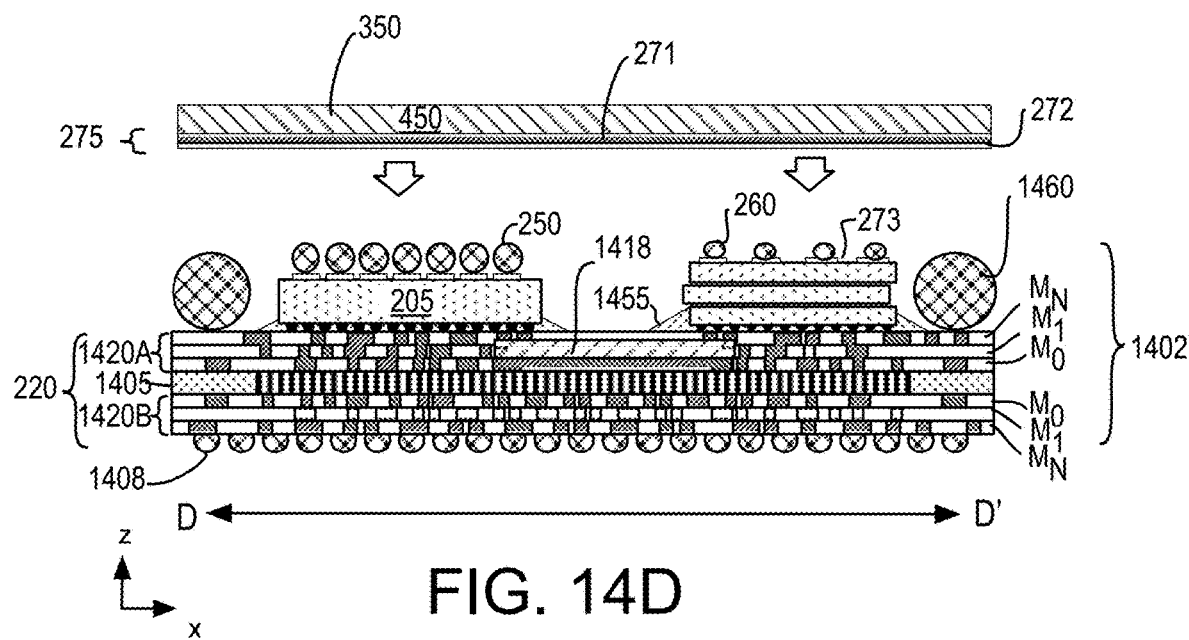
FIG. 14D illustrates cross-sectional views of thermal interconnect interface structures being joined by a solder thermal interconnects during the practice of the methods in FIG. 13, in accordance with some alternative embodiments.

FIG. 14C is a plan view of thermal interconnect interface structures on surface of an IC die assembly 1402, in accordance with some alternative embodiments where the solder TIM thermal interconnects 250, 260 are provided as a component of IC die assembly 1402. FIG. 14D illustrates cross-sectional views of thermal interconnect interface structures being joined by a plurality of solder TIM interconnect during the practice of the methods 1301, in accordance with some alternative embodiments. The cross-sectional view depicted in FIG. 14D is along the D-D' line demarked in FIG. 14C.

As shown in FIGS. 14C and 14D, solder interconnects 250 and 260 are attached to IC die assembly 1402. Solder balls 1460 have also been attached to package substrate 220. IC die assembly 1402 is otherwise substantially the same as IC die assembly 1401 (FIG. 14A-14B). Heat spreader 275 comprising only a laminate of sheet material 271 and metal 272 may be joined to solder interconnects 250, 260 and solder balls 1460, for example with any thermo-compression suitable for forming good solder interconnect joints.

FIG. 15A-15D illustrate cross-sectional views of IC die assemblies, in accordance with some alternative embodiments. The assemblies depicted in FIG. 15A-15D may each be assembled according to methods 1301 (FIG. 13), for example substantially as described for FIG. 14A-14B or FIG. 14C-14D. The assemblies illustrated in FIG. 15A-15D may be provided to a computing system assembler that would integrate assembly 1501 into a higher level system, such as a laptop computer or mobile communication handset, for example.

Figure 15A:
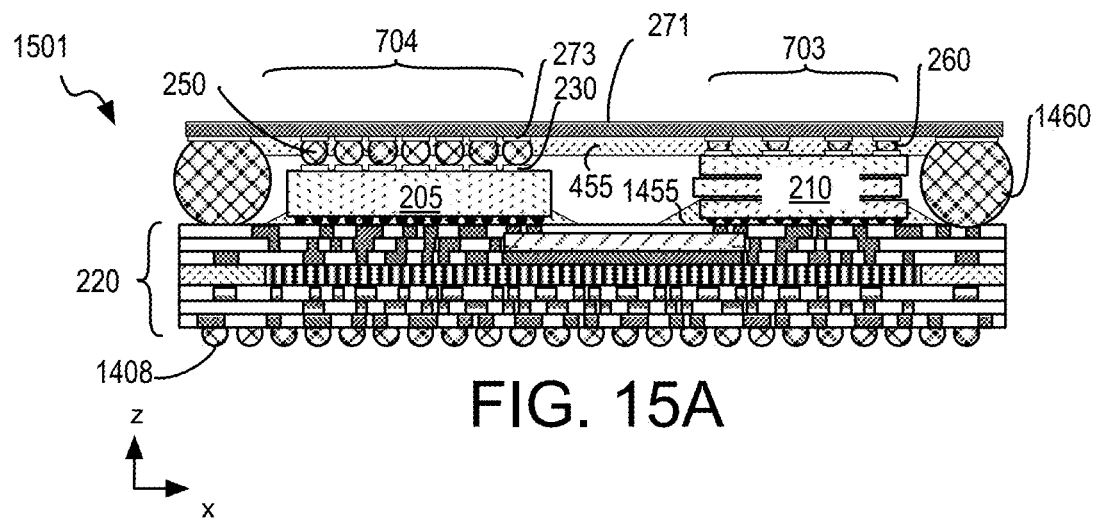
FIGS. 15A, 15B, 15C and 15D illustrate cross-sectional views of IC die assemblies, in accordance with some embodiments.

FIG. 15A illustrates an IC device and integrated heat spreader assembly 1501 in accordance with some embodiments. Assembly 1501 depicts an example where solder interconnects 250 join a plurality of thermal interconnect structures 230 on the IC die side with a plurality of thermal interconnect structures 273 on the heat spreader side.

Figure 15B:
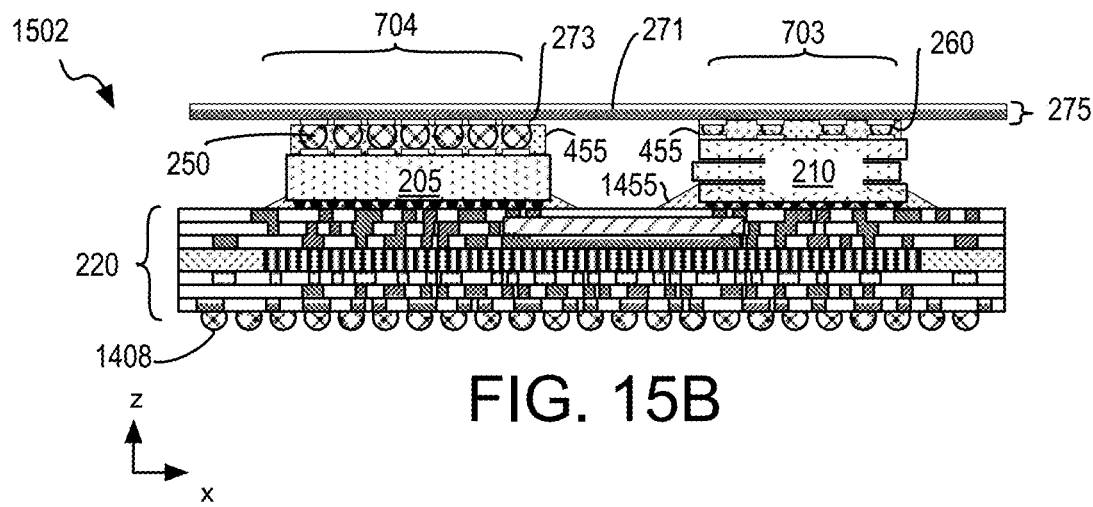

FIG. 15B illustrates an IC device and integrated heat spreader assembly 1502 in accordance with some alternative embodiments where underfill material 455 has been applied after thermo-compression joining of the heat spreader sub-assembly with the IC die assembly. In some embodiments, underfill material 455 might be dispensed as a liquid into a through-hole in heat spreader 275 located over IC die 205, and a through-hole in heat spreader 275 located over IC die 210 so that underfill material 455 is localized to regions 704 and 703 over heat spreader 275 (i.e., only surrounding thermal interconnects 250, 260). Assembly 1502 also illustrates an embodiment where heat spreader 275 includes a cantilevered overhang beyond edges of IC die 205 and 210.

Figure 15C:
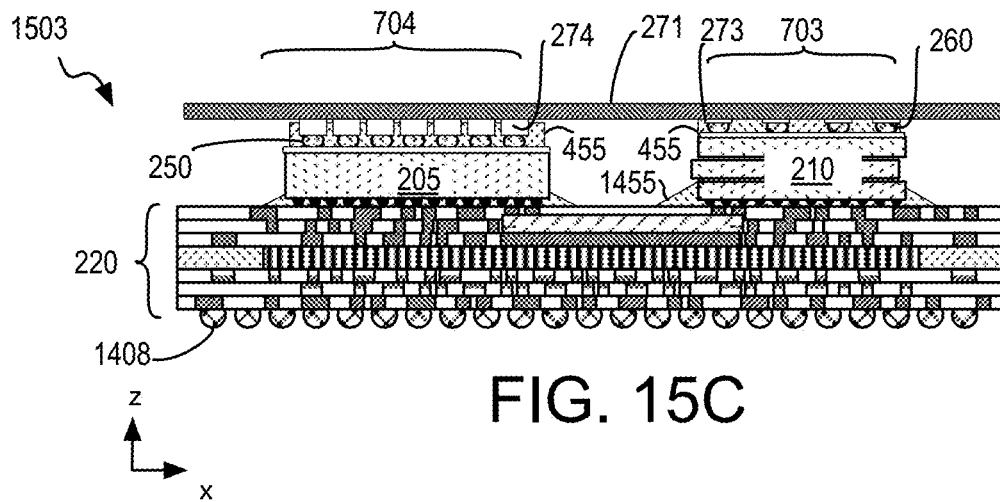

FIG. 15C illustrates an IC device and integrated heat spreader assembly 1503 in accordance with some alternative embodiments where the difference in die thicknesses IC die 205 and 210 is fully accommodated by a difference in z-height of heat spreader-side thermal interconnect interface structures 273 and 274. As such, thermal interconnects 250 may have substantially the same lateral and vertical dimensions as thermal interconnects 260.

Figure 15D:
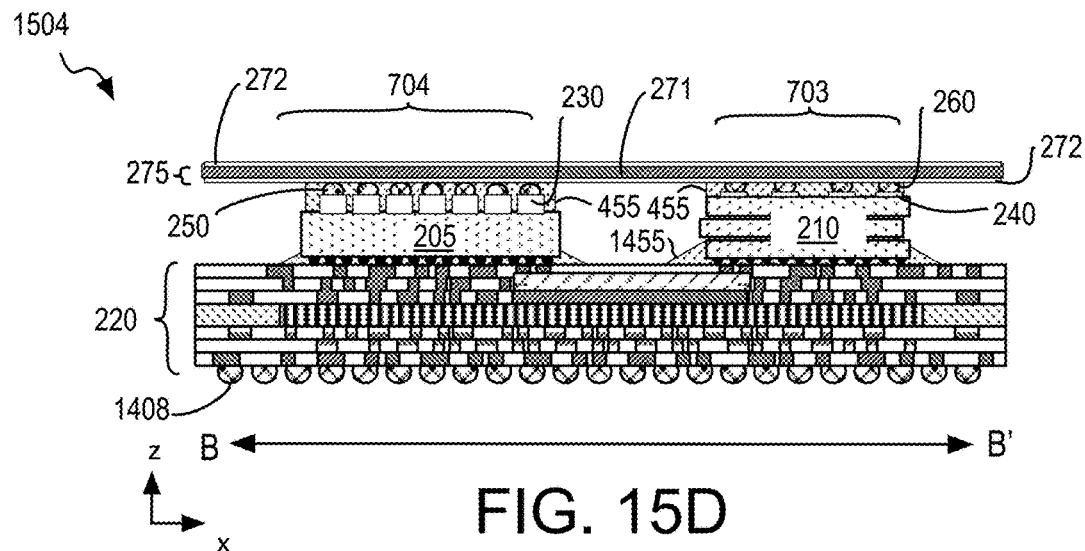

FIG. 15D illustrates an IC device and integrated heat spreader assembly 1504 in accordance with some alternative embodiments where the difference in die thicknesses IC die 205 and 210 is fully accommodated by a difference in z-height of IC die-side thermal interconnect interface structures 230 and 240. As such, thermal interconnects 250 may have substantially the same lateral and vertical dimensions as thermal interconnects 260. Assembly 1504 further illustrates an embodiment where heat spreader 275 comprises sheet material 271 (e.g., graphite sheet) with a contiguous layer of metal 272 (e.g., Cu) in contact with the plurality of thermal interconnects 250, 260. As a laminate, heat spreader 275 further includes metal 281 (e.g., Cu) on a side of sheet material 271 opposite metal 272. This Cu/G/Cu heat spreader architecture may offer particularly good thermal performance as potentially being less than 100 μm, having good stiffness and CTE match for low package warpage, and also allow for electrical grounding of the heat spreader.

Figure 16:
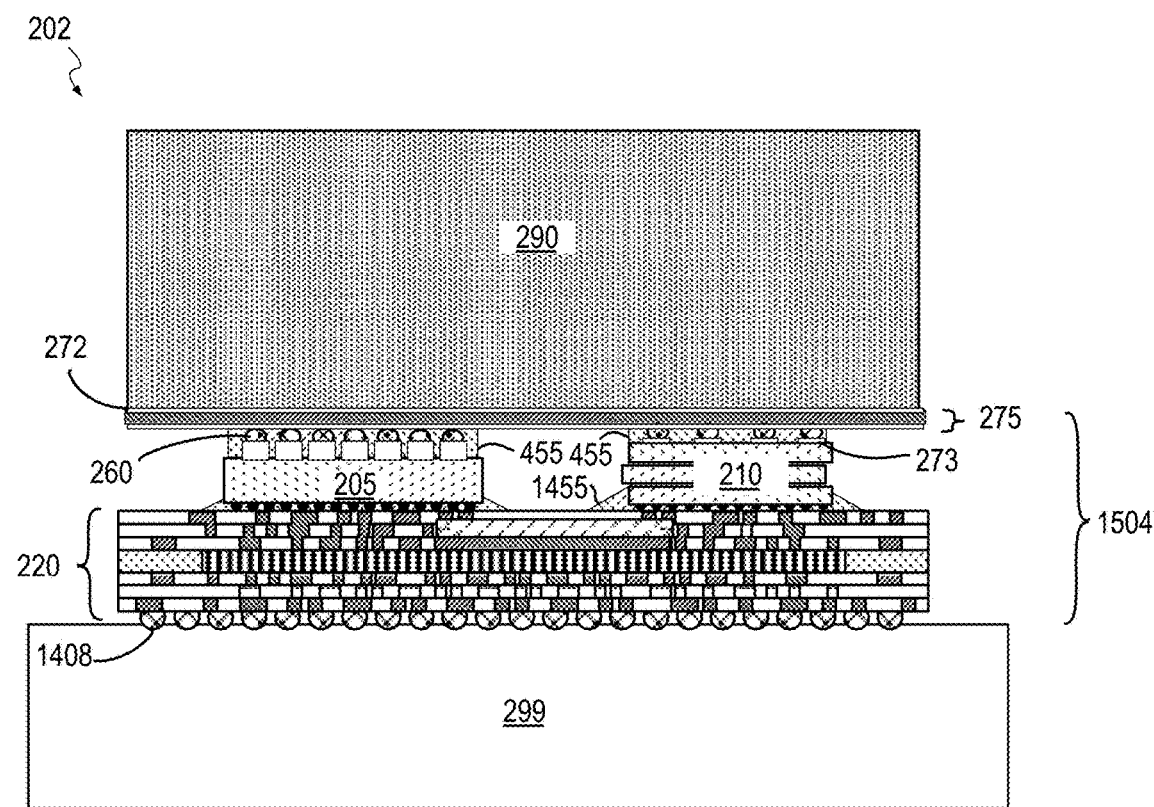
FIG. 16 illustrates a cross-sectional view of a system-level IC device assembly, in accordance with some embodiments.

FIG. 16 illustrates a cross-sectional view of system-level IC device assembly 202, in accordance with some embodiments. As introduced in FIG. 2A, assembly 202 is a system-level integration including integrated IC die-heat spreader assembly 1504, a host component 299 (e.g., PCB), and an IC die package thermal solution 290 (e.g., finned heat sink, cold plate, vapor chamber, heat pipe, etc.).

Figure 17:
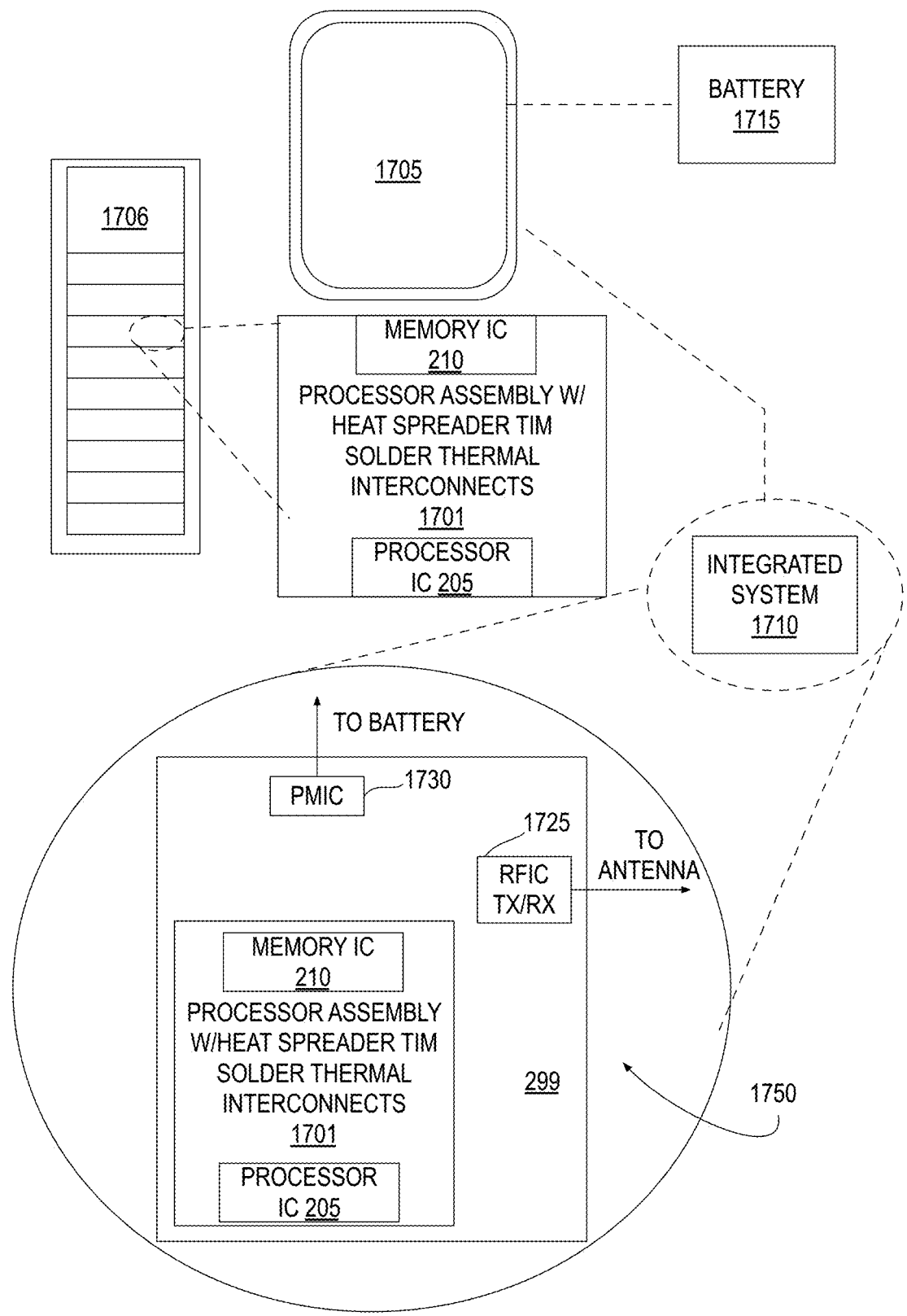
FIG. 17 illustrates a mobile computing platform and a data server machine employing an integrated circuit package including thermal interconnect interface structures and solder array TIM, in accordance with some embodiments.

FIG. 17 illustrates a system in which a mobile computing platform 1705 and/or a data server machine 1706 that includes an IC package assembly 1750 further including a package integrated heat spreader (IHS) and including a plurality of solder thermal interconnects and thermal interfaces, for example in accordance with some embodiments describe elsewhere herein. The server machine 1706 may be any commercial server, for example including any number of high-performance computing platforms disposed within a rack and networked together for electronic data processing, which in the exemplary embodiment includes IC package assembly 1701. The mobile computing platform 1705 may be any portable device configured for each of electronic data display, electronic data processing, wireless electronic data transmission, or the like. For example, the mobile computing platform 1705 may be any of a tablet, a smart phone, laptop computer, etc., and may include a display screen (e.g., a capacitive, inductive, resistive, or optical touchscreen), a package-level integrated system 1710, and a battery 1715.

Whether disposed within the integrated system 1710 illustrated in the expanded view 1750, or as a stand-alone packaged chip within the server machine 1706, IC package assembly 1701 may include memory circuitry (e.g., RAM)

in IC die 210, logic circuitry (e.g., a microprocessor, graphics processor, or the like) in IC die 205. IC package assembly 1701 may be further coupled to a host board, interposer, or component (not depicted). In the illustrated example, IC package assembly 1701 may include an interconnect bridge IC communicatively coupled to both memory IC die 210 and processor IC die 205, for example to facilitate their interconnection.

Integrated system 1710 further includes a power management IC (PMIC) 1730 and an radio frequency IC (RFIC) 1725 having an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 18:
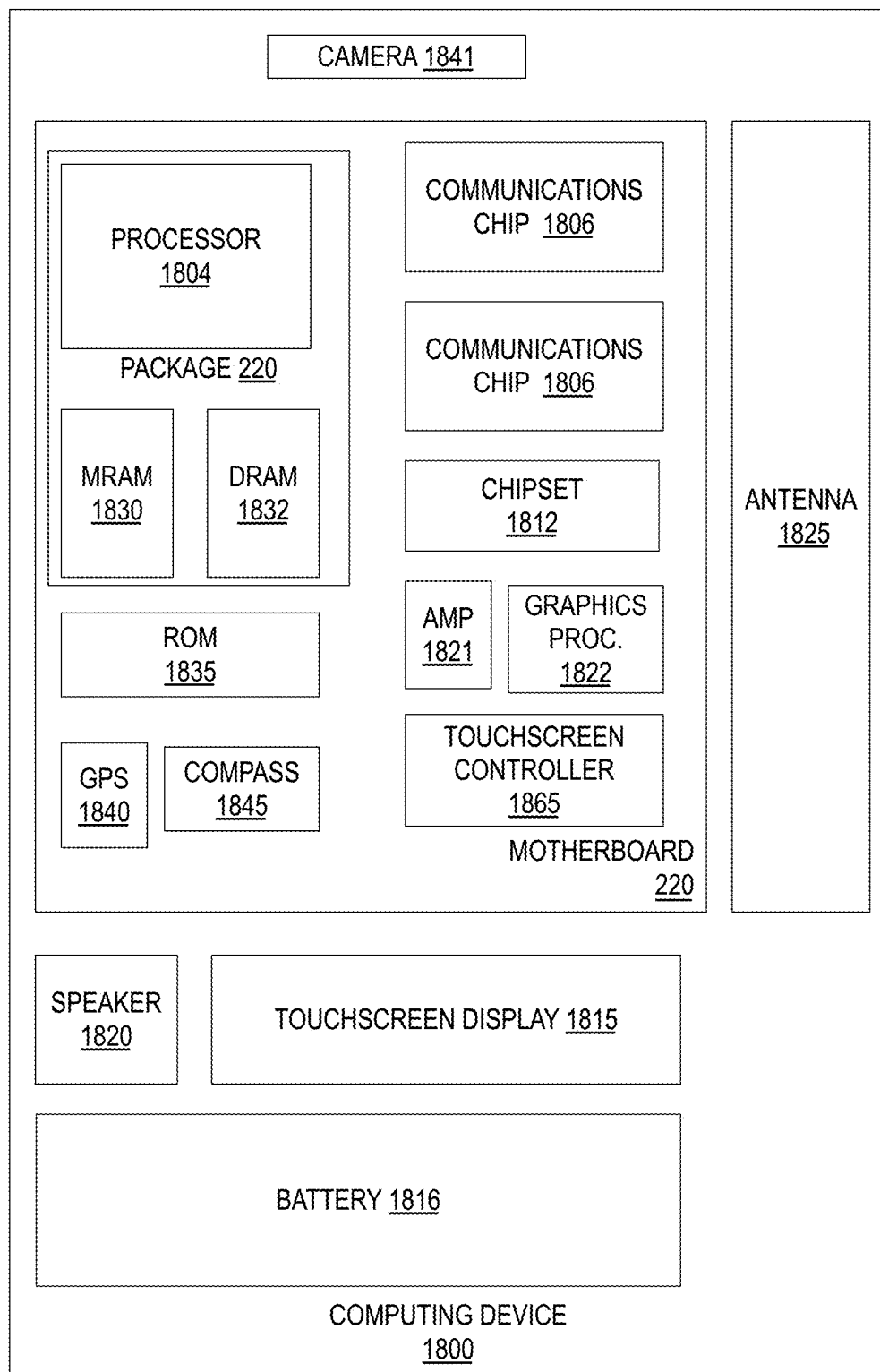
FIG. 18 is a functional block diagram of an electronic computing device, in accordance with some embodiments.

FIG. 18 is a functional block diagram of an electronic computing device 1800, in accordance with some embodiments. Device 1800 further includes motherboard 1801 hosting a number of components, such as, but not limited to, package substrate 220 to which a processor 1804 (e.g., an applications processor) is coupled. Processor 1804 may be physically and/or electrically coupled to package substrate 220. In some examples, processor 1804 is part of an IC package assembly including solder thermal interconnects coupled to a heat spreader through a plurality of thermal interconnect interface structures, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1806 may also be physically and/or electrically coupled to motherboard 1801. In further implementations, communication chips 1806 may be part of processor 1804. Depending on its applications, computing device 1800 may include other components that may or may not be physically and electrically coupled to package substrate 220. These other components include, but are not limited to, volatile memory (e.g., DRAM 1832), non-volatile memory (e.g., ROM 1835), flash memory (e.g., NAND or NOR), magnetic memory (MRAM 1830), a graphics processor 1822, a digital signal processor, a crypto processor, a chipset 1812, an antenna 1825, touchscreen display 1815, touchscreen controller 1865, battery 1816, audio codec, video codec, power amplifier 1821, global positioning system (GPS) device 1840, compass 1845, accelerometer, gyroscope, speaker 1820, camera 1841, and mass storage device (such as hard disk drive, solid-state drive (SSD), compact disk (CD), digital versatile disk (DVD), and so forth, or the like. Any of these components may be assembled to a package that includes an integral structural member, for example according to one or more embodiments described elsewhere herein.

Communication chips 1806 may enable wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including, but not limited to, those described elsewhere herein. As discussed, computing device 1800 may include a plurality of communication chips 1806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) device assembly comprises a package substrate, an IC die including a first side electrically coupled to the package substrate through a plurality of first level electrical interconnects, a plurality of thermal interconnects comprising a solder alloy, the thermal interconnects coupled to a second side of the IC die, opposite the first side, and a heat spreader coupled to the IC die through the plurality of thermal interconnects, wherein the heat spreader comprises a sheet of graphite and one or more first metals between the sheet of graphite and the thermal interconnects.

In second examples, for any of the first examples the sheet of graphite is crystalline or pyrolytic graphite sheet.

In third examples, for any of the first or second examples the sheet of graphite has a layer thickness of 25 µm, or less.

In fourth examples, for any of the first through third examples the first metals comprise copper in direct contact with the sheet of graphite.

In fifth examples, for any of the first through fourth examples the first metals further comprise a surface finish between the copper and the solder alloy.

In sixth examples, for any of the fifth examples the surface finish comprises at least one of Ni or Au.

In seventh examples, for any of the first through sixth examples the one or more first metals are in contact with a first side of the sheet of graphite, between the sheet of graphite and the thermal interconnects, and wherein the heat spreader further comprises one or more first metals in contact with a second side of the sheet of graphite, opposite the first side.

In eighth examples, for any of the seventh examples the one or more first metals on each of the first side and the second side of the sheet of graphite have a thickness of 25 µm, or less.

In ninth examples, for any of the first through eighth examples the assembly further comprises a polymer underfill material between individual ones of the plurality of thermal interconnects.

In tenth examples, for any of the first through ninth examples the second side of the IC die comprises a second metal between individual ones of the plurality of thermal interconnects and a crystalline semiconductor material of the IC die.

In eleventh examples, for any of the tenth examples the IC die comprises individual ones of a plurality of discrete metallic features distributed over the second side of the IC die and wherein the metallic features comprise the second metal.

In twelfth examples, for any of the tenth through eleventh examples a plurality of thermal interconnect lands comprises at least one of the first metals or second metals, individual ones of the lands corresponding to individual ones of the thermal interconnects.

In thirteenth examples, for any of the first through twelfth examples individual ones of the plurality of thermal interconnects have a thickness between the heat spreader and the IC die of 100 µm, or less.

In fourteenth examples, for any of the thirteenth examples the IC die is a first IC die, the assembly further comprises a second IC die laterally adjacent to the first IC die and coupled to the package substrate, the first IC die has a first thickness and the second IC die has a second thickness, less than the first thickness, and a first of the thermal interconnects between the heat spreader and the first IC die have less thickness than a second of the thermal interconnects between the heat spreader and the second IC die.

In fifteenth examples, an integrated circuit (IC) die heat spreader comprises a sheet of graphite, and a plurality thermal interconnect lands on a first side of the sheet of graphite, wherein thermal interconnect lands comprises one or more first metals.

In sixteenth examples, for any of the fifteenth examples the sheet of graphite is a crystalline or pyrolytic graphite sheet having a layer thickness of 25 µm, or less, and the one or more first metals has a thickness of 25 µm, or less.

In seventeenth examples, for any of the fifteenth through sixteenth examples the one or more first metals are in contact with a first side of the sheet of graphite, and wherein the heat spreader further comprises a metal in contact with a second side of the sheet of graphite, opposite the first side.

In eighteenth examples, for any of the fifteenth through seventeenth examples the plurality of lands comprise a plurality of discrete metallic features spaced apart over the first side of the sheet of graphite.

In nineteenth examples, for any of the fifteenth through eighteenth examples individual ones of the plurality of solder lands comprise a region of a contiguous layer of the first metal separated from adjacent regions of the contiguous layer by a masking material.

In twentieth examples, the heat spreader further comprises a plurality of thermal interconnects comprising a solder alloy, individual ones of the thermal interconnects in contact with corresponding ones of the lands.

In twenty-first examples, a computing system comprises a processor IC, wherein a first side of the processor IC is coupled to a first side of a package substrate through a plurality of first electrical interconnects. The system comprises a heat spreader, wherein a first side of the heat spreader is coupled to a second side of the processor IC through a plurality of thermal interconnects that comprise a solder alloy, wherein the heat spreader comprises a sheet of graphite and one or more first metals between the sheet of graphite and the thermal interconnects. The system comprises a heat exchanger coupled to a second side of the heat spreader. The system comprises a host board coupled to a second side of the package substrate through a plurality of second electrical interconnects.

In twenty-second examples, for any of the twenty-first examples the heat exchanger comprises a finned heat sink, a cold plate, or a heat pipe.

In twenty-third examples, for any of the twenty-first through twenty-second examples the system further comprises a memory IC adjacent to the processor IC, wherein a first side of the memory IC is coupled to the first side of a package substrate by a second plurality of first electrical interconnects, wherein the first side of the heat spreader is further coupled to a second side of the memory IC through a second plurality of the thermal interconnects.

In twenty-fourth examples, for any of the twenty-first through twenty-third examples a peripheral portion of the heat spreader beyond an edge of the processor IC is coupled to a peripheral portion of the package substrate through one or more solder balls or through a package stiffener.

In twenty-fifth examples, for any of the twenty-first through twenty-fourth examples the heat spreader is electrically coupled through the solder balls to a voltage potential of the package substrate.

In twenty-sixth examples, an integrated circuit (IC) device assembly comprises a package substrate, an IC die having a first side electrically coupled to the package substrate through a plurality of first level electrical interconnects, and a second side comprising a plurality of metallic lands. The assembly comprises a heat spreader coupled to the second side of the IC die through a plurality of thermal interconnects comprising a solder alloy, wherein individual ones of the plurality of thermal interconnects are in contact with corresponding ones of the metallic lands.

In twenty-seventh examples, for any of the twenty-sixth examples a first metal of the lands is in direct contact with a crystalline substrate material of the IC die.

In twenty-eighth examples, for any of the twenty-sixth through twenty-seventh examples individual ones of the plurality of thermal interconnects have a first thickness, individual ones of the plurality of lands have a second thickness, and at least one of the first and second thicknesses is 100 µm, or less.

In twenty-ninth examples, for any of the twenty-eighth examples the plurality of lands comprises a plurality of discrete metal features spaced apart over the second side of the IC die, and a first portion of a crystalline substrate material of the IC die is between adjacent ones of the metal features.

In thirtieth examples, for any of the twenty-ninth examples a surface of the first portion of the crystalline substrate material is recessed below a plane of an interface between an adjacent one of the metal features and a second portion of the crystalline substrate material.

In thirty-first examples, for any of the thirtieth examples the recess has a depth of at least 10 µm.

In thirty-second examples, for any of the thirtieth through thirty-first examples the metal features are arrayed in a two dimensional (2D) grid of fixed spacing and each of the metal features has substantially the same area.

In thirty-third examples, for any of the thirty-second examples a depth of the recess is greater at intersections of the 2D grid than outside of the intersections.

In thirty-fourth examples, for any of the twenty-ninth examples at least one of the first and second thicknesses varies by at least 20 µm.

In thirty-fifth examples, for any of the twenty-sixth through thirty-fourth examples the IC die is a first IC die and the assembly further comprises a second IC die laterally adjacent to the first IC die. The first IC die has a first die thickness, and the second IC die has a second die thickness, greater than the first die thickness. A first of the lands is on the first IC die, and a second of the lands is on the second IC die. A first of the thermal interconnects is coupled to the first of the lands, and a second of the thermal interconnects is coupled to the second of the lands. A first z-height equal to a thickness of the first of the solder lands summed with a thickness of the first of the thermal interconnects is greater than a second z-height equal to a thickness of the second of the lands summed with a thickness of the second of the thermal interconnects.

In thirty-sixth examples, for any of the thirty-fifth examples, there is a difference of at least 250 μm between the first die thickness and the second die thickness. A difference between the first and second z-heights is substantially equal to the difference between the first and second die thicknesses.

In thirty-seventh examples, for any of the thirty-sixth examples the thickness of the first of the lands is substantially equal to the thickness of the second of the lands.

In thirty-eighth examples for any of the thirty-sixth examples the thickness of the first of the thermal interconnects is substantially equal to the thickness of the second of the thermal interconnects.

In thirty-ninth examples, for any of the twenty-ninth examples individual ones of the plurality of lands comprise a region of a contiguous metal layer separated from adjacent regions of the metal layer by a masking material.

In fortieth examples, for any of the thirty-ninth examples the masking material comprises a solder resist.

In forty-first examples, for any of the twenty-sixth through fortieth examples the heat spreader comprises a graphite sheet having a layer thickness of 25 μm, or less, and a metal in contact with the graphite sheet and between the graphite sheet and the thermal interconnects.

In forty-second examples an integrated circuit (IC) die heat spreader comprises a sheet of a first material, a plurality of thermal interconnect lands in contact with a first side of the sheet. The plurality of lands comprise one or more layers of metal. The heat spreader comprises a plurality of thermal interconnects comprising a solder alloy, individual ones of the thermal interconnects in contact with corresponding ones of the lands.

In forty-third examples, for any of the forty-second examples the first material is crystalline graphite or pyrolytic graphite and the sheet has a thickness of 25 μm, or less.

In forty-fourth examples, for any of the forty-second through forty-third examples the heat spreader further comprises a metal in contact with a second side of the sheet, opposite the first side.

In forty-fifth examples, for any of the forty-second through forty-fourth examples the plurality of lands comprise a plurality of discrete metal features spaced apart over the first side of the sheet.

In forty-sixth examples, for any of the forty-second through forty-fifth examples individual ones of the plurality of lands comprise a region of a contiguous metal layer separated from adjacent regions of the metal layer by a masking material.

In forty-seventh examples a computing system comprises a processor IC with a first side coupled to a first side of a package substrate by a plurality of first electrical interconnects. The system comprises a heat spreader with a first side coupled to a second side of the processor IC through a plurality of thermal interconnects. The thermal interconnects comprise a solder alloy, and individual ones of the thermal interconnects are in contact with corresponding ones of a plurality of thermal interconnect lands distributed over the second side of the processor IC. The system comprises a heat exchanger coupled to a second side of the heat spreader. The system comprises a host board coupled to a second side of the package substrate by plurality of second electrical interconnects.

In forty-eighth examples, for any of the forty-seventh examples the heat exchanger comprises a finned heat sink, a cold plate, or a heat pipe.

In forty-ninth examples, for any of the forty-seventh through forty-eighth examples the system further comprises a memory IC adjacent to the processor IC. A first side of the memory IC is coupled to the first side of a package substrate by a second plurality of first electrical interconnects. The first side of the heat spreader is further coupled to a second side of the memory IC through a second plurality of the thermal interconnects.

In fiftieth examples, for any of the forty-seventh through forty-ninth examples a peripheral portion of the heat spreader beyond an edge of the processor IC is coupled to a peripheral portion of the package substrate through one or more solder balls or through a package stiffener.

In fifty-first examples, for any of the forty-seventh through fiftieth examples the heat spreader comprises a conductive material, and is electrically coupled through the solder balls to a voltage potential of the package substrate.

In fifty-second examples, an integrated circuit (IC) device assembly comprises a package substrate, an IC die having a first side electrically coupled to the package substrate through a plurality of first level electrical interconnects, and a heat spreader coupled to a second side of the IC die through a plurality of thermal interconnects comprising a solder alloy, wherein at least one of the heat spreader and the second side of the IC die comprises a plurality of thermal interconnect lands, individual ones of the lands in contact with corresponding ones of the thermal interconnects In fifty-third examples, the IC die is a first IC die and the assembly further comprises a second IC die laterally adjacent to the first IC die. The first IC die has a first die thickness, and the second IC die has a second die thickness, greater than the first die thickness. A first of the of the lands is between the first IC die and the heat spreader, and a second of the lands is between the second IC die and the heat spreader. A first of the thermal interconnects is coupled to the first of the lands, and a second of the thermal interconnects is coupled to the second of the lands. A first z-height equal to a thickness of the first of the solder lands summed with a thickness of the first of the thermal interconnects is greater than a second z-height equal to a thickness of the second of the lands summed with a thickness of the second of the thermal interconnects.

In fifty-fourth examples, for any of the fifty-third examples there is a difference of at least 250 μm between the first die thickness and the second die thickness, and a difference between the first and second z-heights is substantially equal to the difference between the first and second die thicknesses.

In fifty-fifth examples, for any of the fifty-fourth examples the thickness of the first of the lands is substantially equal to the thickness of the second of the lands.

In fifty-sixth examples, for any of the fifth-fifth examples individual ones of the plurality of lands have a thickness of 100 μm, or less.

In fifty-seventh examples, for any of the fifty-fourth examples the thickness of the first of the thermal interconnects is substantially equal to the thickness of the second of the thermal interconnects.

In fifty-eighth examples for any of the fifty-seventh examples individual ones of the plurality of thermal interconnects have a thickness of 100 μm, or less.

In fifty-ninth examples, for any of the fifty-third examples individual ones of the plurality of lands comprise a region of a contiguous metal layer separated from adjacent regions of the contiguous metal layer by a masking material.

In sixtieth examples, for any of the fifty-ninth examples the masking material comprises a solder resist.

In sixty-first examples, for any of the fifty-third examples the plurality of lands comprises a plurality of discrete metal features spaced apart over a surface of the IC die or heat spreader, and wherein a first portion of the IC die or heat spreader is between adjacent ones of the metal features.

In sixty-second examples, for any of the fifty-third through sixty-first examples a first metal of the lands is in direct contact with a nonmetallic material of the heat spreader or of the IC die.

In sixty-third examples, for any of the sixty-second examples the first metal of the lands is in direct contact with a nonmetallic material of the heat spreader.

In sixty-fourth examples, for any of the sixty-third examples the nonmetallic material comprises a sheet of graphite having a thickness of 25 µm, or less.

In sixty-fifth examples, for any of the sixty-second examples a first metal of the lands is in direct contact with a crystalline substrate material of the IC die.

In sixty-sixth examples, for any of the sixty-fifth examples the plurality of lands comprises a plurality of discrete metal features spaced apart over the second side of the IC die, and wherein a first portion of a crystalline substrate material of the IC die is between adjacent ones of the metal features.

In sixty-seventh examples, for any of the sixty-sixth examples a surface of the first portion of the crystalline substrate material is recessed below a plane of an interface between an adjacent one of the metal features and a second portion of the crystalline substrate material.

In sixty-eighth examples, an integrated circuit (IC) die heat spreader comprises a plurality of thermal interconnect lands on a first side of the heat spreader, wherein the plurality of lands comprise one or more layers of metal. The heat spreader comprises a plurality of thermal interconnects comprising a solder alloy, individual ones of the thermal interconnects in contact with corresponding ones of the lands. A thickness of at least one of the lands or thermal interconnects varies between a first area of the heat spreader that is to couple to a first IC die of a first die thickness and a second area of the heat spreader that is to couple to a second IC die of a second die thickness, different than the first die thickness.

In sixty-ninth examples, for any of the sixty-eighth examples the heat spreader further comprises a sheet of graphite in contact with the lands, the sheet having a thickness of 25 µm, or less.

In seventieth examples, for any of the sixty-eighth through sixty-ninth examples the heat spreader further comprises a metal in contact with a second side of the sheet, opposite the first side.

In seventy-first examples, for any of the sixty-eighth examples the plurality of lands comprise a plurality of discrete metal features spaced apart over the first side of the sheet.

In seventy-second examples, for any of the sixty-eighth examples individual ones of the plurality of lands comprise a region of a contiguous metal layer separated from adjacent regions of the metal layer by a masking material.

In seventy-third examples, for any of the sixty-eighth examples there is a difference of at least 250 µm between the first die thickness and the second die thickness, and the thickness of at least one of the lands or thermal interconnects varies between the first area and the second area of the heat spreader by an amount substantially equal to the difference between the first and second die thicknesses.

In seventy-fourth examples, for any of the seventy-third examples the thickness of the first of the lands is substantially equal to the thickness of the second of the lands In seventy-fifth examples, for any of the seventy-third examples the thickness of the first of the thermal interconnects is substantially equal to the thickness of the second of the thermal interconnects.

In seventy-sixth examples a computing system comprises a package substrate, a processor IC die having a first side electrically coupled to the package substrate through a first plurality of first level electrical interconnects, a memory IC die having a first side electrically coupled to the package substrate through a second plurality of first level electrical interconnects, and a heat spreader coupled to a second side of both the processor IC die and the memory IC die through a plurality of thermal interconnects comprising a solder alloy. At least one of the heat spreader and the second side of the process IC die and the memory IC die comprises a plurality of thermal interconnect lands, individual ones of the lands in contact with corresponding ones of the thermal interconnects. The system comprises a heat exchanger coupled to the heat spreader, and a host board coupled to a second side of the package substrate by plurality of second electrical interconnects.

In seventy-seventh examples, for any of the seventy-sixth examples a peripheral portion of the heat spreader beyond an edge of the processor IC is coupled through to a peripheral portion of the package substrate through one or more solder balls or through a package stiffener.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

The invention claimed is:

1. An integrated circuit (IC) device assembly, comprising:
   a package substrate;
   an IC die having a first side electrically coupled to the package substrate through a plurality of first interconnects; and
   a heat spreader coupled to a second side of the IC die through a plurality of second interconnects comprising a solder alloy, wherein the heat spreader comprises a plurality of metallic lands, individual ones of the plurality of metallic lands in contact with corresponding ones of the plurality of second interconnects.

2. The IC device assembly of claim 1, wherein:
   the IC die is a first IC die and the assembly further comprises a second IC die laterally adjacent to the first IC die;
   the first IC die has a first die thickness, and the second IC die has a second die thickness, greater than the first die thickness;
   a first of the plurality of metallic lands is between the first IC die and the heat spreader, and a second of the plurality of metallic lands is between the second IC die and the heat spreader;

a first of the plurality of second interconnects is coupled to the first of the plurality of metallic lands, and a second of the plurality of second interconnects is coupled to the second of the plurality of metallic lands; and a first z-height equal to a thickness of the first of the plurality of metallic lands summed with a thickness of the first of the plurality of second interconnects is greater than a second z-height equal to a thickness of the second of the plurality of metallic lands summed with a thickness of the second of the plurality of second interconnects.

3. The IC device assembly of claim 2, wherein:
there is a difference of at least 250 μm between the first die thickness and the second die thickness; and
a difference between the first and second z-heights is substantially equal to the difference between the first and second die thicknesses.

4. The IC device assembly of claim 3, wherein the thickness of the first of plurality of the metallic lands is substantially equal to the thickness of the second of the plurality of the metallic lands.

5. The IC device assembly of claim 4, wherein individual ones of the plurality of metallic lands have a thickness of 100 μm, or less.

6. The IC device assembly of claim 3, wherein the thickness of the first of the plurality of second interconnects is substantially equal to the thickness of the second of the plurality of second interconnects.

7. The IC device assembly of claim 6, wherein individual ones of the plurality of second interconnects have a thickness of 100 μm, or less.

8. The IC device assembly of claim 1, wherein individual ones of the plurality of metallic lands comprise a region of a contiguous metal layer laterally spaced apart from adjacent regions of the contiguous metal layer by a masking material.

9. The IC device assembly of claim 8, wherein the masking material comprises a solder resist.

10. The IC device assembly of claim 1, wherein the plurality of metallic lands comprises a plurality of discrete metal features spaced apart over a surface of the heat spreader, and wherein a first portion of the heat spreader is between adjacent ones of the metal features.

11. The IC device assembly of claim 1, wherein the plurality of the metallic lands comprise a metal in direct contact with a nonmetallic material of the heat spreader or of the IC die.

12. The IC device assembly of claim 11, wherein the metal is in direct contact with a nonmetallic material of the heat spreader.

13. The IC device assembly of claim 12, wherein the nonmetallic material comprises a sheet of graphite having a thickness of 25 μm, or less.

14. An integrated circuit (IC) die heat spreader, the heat spreader comprising:

a plurality of interconnect lands on a first side of the heat spreader, wherein individual ones of the plurality of interconnect lands comprise one or more layers of metal; and a plurality of interconnects comprising a solder alloy, individual ones of the plurality of interconnects in contact with corresponding ones of the plurality of interconnect lands, wherein a thickness of at least one of the plurality of interconnect lands or plurality of interconnects varies between a first area of the heat spreader and a second area of the heat spreader.

15. The IC die heat spreader of claim 14, wherein:
the heat spreader further comprises a sheet of graphite in contact with the plurality of interconnect lands, the sheet of graphite having a thickness of 25 μm, or less.

16. The IC die heat spreader of claim 15, wherein the heat spreader further comprises a metal in contact with a second side of the sheet of graphite, opposite the first side.

17. The IC die heat spreader of claim 15, wherein the plurality of interconnect lands comprise a plurality of discrete metal features spaced apart over the first side of the sheet of graphite.

18. The IC die heat spreader of claim 14, wherein individual ones of the plurality of interconnect lands comprise a region of a contiguous metal layer laterally spaced apart from adjacent regions of the contiguous metal layer by a masking material.

19. The IC die heat spreader of claim 14, wherein the thickness varies by at least 250 μm between the first area of the heat spreader and the second area of the heat spreader.

20. The IC die heat spreader of claim 19, wherein a thickness of a first of the plurality of interconnect lands is substantially equal to a thickness of a second of the plurality of interconnect lands.

21. The IC die heat spreader of claim 19, wherein a thickness of a first of the plurality of interconnects is substantially equal to a thickness of a second of the plurality of interconnects.

22. A computing system, comprising:
a package substrate;
a processor IC die having a first side electrically coupled to the package substrate through a first plurality of first interconnects;
a memory IC die having a first side electrically coupled to the package substrate through a second plurality of first interconnects;
a heat spreader coupled to a second side of both the processor IC die and the memory IC die through a plurality of second interconnects comprising a solder alloy, wherein a the heat spreader comprises a plurality of interconnect lands, individual ones of the plurality of interconnect lands in contact with corresponding ones of the plurality of second interconnects;
a heat exchanger coupled to the heat spreader; and
a host board coupled to a second side of the package substrate by a plurality of third interconnects.

* * * * *